(12) United States Patent
Estes et al.

(10) Patent No.: US 7,173,275 B2
(45) Date of Patent: Feb. 6, 2007

(54) THIN-FILM TRANSISTORS BASED ON TUNNELING STRUCTURES AND APPLICATIONS

(75) Inventors: Michael J. Estes, Longmont, CO (US); Blake J. Eliasson, Boulder, CO (US)

(73) Assignee: Regents of the University of Colorado, Boulder, CO (US)

( * ) Notice: Subject to any disclaimer, the term of this patent is extended or adjusted under 35 U.S.C. 154(b) by 0 days.

(21) Appl. No.: 11/113,587

(22) Filed: Apr. 25, 2005

(65) Prior Publication Data
US 2006/0012000 A1    Jan. 19, 2006

Related U.S. Application Data

(63) Continuation-in-part of application No. 10/877,874, filed on Jun. 26, 2004, now Pat. No. 7,105,852, and a continuation of application No. 10/347,534, filed on Jan. 20, 2003, now Pat. No. 6,756,649, which is a continuation of application No. 09/860,972, filed on May 21, 2001, now Pat. No. 6,563,185.

(60) Provisional application No. 60/565,700, filed on Apr. 26, 2004.

(51) Int. Cl.
*H01L 29/06* (2006.01)
(52) U.S. Cl. .................. 257/29; 257/425; 257/E39.013
(58) Field of Classification Search ............... 257/425, 257/29, 30, 31
See application file for complete search history.

(56) References Cited

U.S. PATENT DOCUMENTS

| | | |
|---|---|---|
| 4,163,920 A | 8/1979 | Lambe et al. |
| 4,272,641 A | 6/1981 | Hanak |
| 4,442,185 A | 4/1984 | Skotheim |
| 4,482,779 A | 11/1984 | Anderson |
| H667 H | 9/1989 | Bedair et al. |
| 4,878,095 A * | 10/1989 | Bending et al. ............. 257/23 |
| 4,973,858 A | 11/1990 | Chang |
| 4,980,312 A | 12/1990 | Harris et al. |

(Continued)

OTHER PUBLICATIONS

L. O. Hocker, D. R. Sokoloff, V. Daneu, A. Szoke, and A. Javan, Frequency Mixing in the Infrared and Far-Infrared using a Metal-to-Metal Point Contact Diode, Jun. 15, 1968, American Institute of Physics, V 12, N 12, p. 401-402.

(Continued)

*Primary Examiner*—Andy Huynh
*Assistant Examiner*—Thinh T Nguyen
(74) *Attorney, Agent, or Firm*—Pritzkau Patent Group, LLC

(57) ABSTRACT

A hot electron transistor includes an emitter electrode, a base electrode, a collector electrode, and a first tunneling structure disposed and serving as a transport of electrons between the emitter and base electrodes. The first tunneling structure includes at least a first amorphous insulating layer and a different, second insulating layer such that the transport of electrons includes transport by means of tunneling. The transistor further includes a second tunneling structure disposed between the base and collector electrodes. The second tunneling structure serves as a transport of at least a portion of the previously mentioned electrons between the base and collector electrodes by means of ballistic transport such that the portion of the electrons is collected at the collector electrode. An associated method for reducing electron reflection at interfaces in a thin-film transistor is also disclosed.

11 Claims, 27 Drawing Sheets

U.S. PATENT DOCUMENTS

| | | | |
|---|---|---|---|
| 5,018,000 A | 5/1991 | Yamada et al. |
| 5,019,530 A | 5/1991 | Kleinsasser et al. |
| 5,067,788 A | 11/1991 | Jannson et al. |
| 5,302,838 A | 4/1994 | Roenker et al. |
| 5,326,984 A | 7/1994 | Rosencher et al. |
| 5,455,451 A | 10/1995 | Usagawa et al. |
| 5,543,652 A | 8/1996 | Ikeda et al. |
| 5,606,177 A | 2/1997 | Wallace et al. |
| 5,621,222 A | 4/1997 | Kimura |
| 5,796,119 A | 8/1998 | Seabaugh |
| 5,825,049 A | 10/1998 | Simmons et al. |
| 5,825,240 A | 10/1998 | Geis et al. |
| 5,883,549 A | 3/1999 | De Los Santos |
| 5,895,934 A | 4/1999 | Harvey et al. |
| 5,994,891 A | 11/1999 | Hubbell |
| 6,034,809 A | 3/2000 | Anemogiannis |
| 6,049,308 A | 4/2000 | Hietala et al. |
| 6,077,722 A | 6/2000 | Jansen et al. |
| 6,107,562 A | 8/2000 | Hashimoto et al. |
| 6,110,393 A | 8/2000 | Simmons et al. |
| 6,121,541 A | 9/2000 | Arya |
| 6,195,485 B1 | 2/2001 | Coldren et al. |
| 6,211,531 B1 | 4/2001 | Nakazato et al. |
| 6,284,557 B1 | 9/2001 | Yiu et al. |
| 6,329,655 B1 | 12/2001 | Jack et al. |
| 6,442,321 B1 | 8/2002 | Berini |
| 6,534,784 B2 | 3/2003 | Eliasson et al. |
| 6,563,185 B2 | 5/2003 | Moddel et al. |
| 6,614,960 B2 | 9/2003 | Berini |
| 2003/0059147 A1 | 3/2003 | Berini |
| 2003/0179974 A1 | 9/2003 | Estes et al. |

OTHER PUBLICATIONS

S. M. Faris, T. Kenneth Gustafson, and John C. Wiesner, Detection of Optical Infrared Radiation with DC-Biased Electron-Tunneling Metal-Barrier-Metal Diodes, Jul. 1973, IEEE Journal of Quantum Electronics, V QE-09, N 7, p. 737-745.

C. Fumeaux, W. Herrmann, F. K. Kneubuhl, and H. Rothuizen, Nanometer Thin-Film Ni-NiO-Ni Diodes for Detection and Mixing of 30 THz Radiation, Jul. 1998, Infrared Physics and technology, V 39, 123-183.

B. Michael Kale, Electron Tunneling Devices in Optics, Mar. 1985, Optical Engineering, V 24, N 2, p. 267-274.

G. Papp, M. DiVentra, C. Coluzza, A. Baldereschi, and G. Margaritondo, Current Rectification through a Single-Barrier Resonant Tunneling Quantum Structure, 1995, Superlattices and Microstructures, V 17, N 3, p. 273-275.

Alexander Korotkov and Konstantin Likharev, Resonant Fowler-Nordheim Tunneling through Layered Tunnel Barriers and its Possible Applications, Mar. 1999, International Electron Device Meeting Technical Digest.

T. Suemasu et al, Metal (CoSi$_2$)Insulator (CaF$_2$) Resonant Tunneling Diode, Jan. 1994, Jpn. Journal of Applied Physics, V 33, p. 57-65.

M. Asada, K. Osada, and W. Saitoh, Theoretical Analysis and Fabrication of Small Area Metal/Insulator Resonant Tunneling Diode Integrated with Patch Antenna for Terahertz Photon Assisted Tunneling, 1998, Solid State Electronics, V 42, N7-8, p. 1543-1546.

Aleksanyan et al, Feasibility of Developing a Tunable Oscillator Utilizing a System of Metal-Barrier-Metal-Barrier-Metal Junctions, May 1981, Sov. J Quantum Electron, vol. 11, No. 5, pp. 635-637.

Aleksanyan et al, Generation of Electromagnetic Oscillations in Metal-Barrier-Metal-Barrier-Metal Structures, Aug. 1982, Sov. J. Quantum Electron., vol. 12, No. 8, pp. 1090-1092.

Belenov et al, Amplification of Plasma Oscillations in Complex Metal-Barrier-Metal Structures, Jul. 1982, Sov. J. Quantum Electron., vol. 12, No. 7, pp. 930-931.

Belenov et al, Investigation of the Radiation Emitted by Metal-Barrier-Metal Stuctures, Apr. 1983, Sov. J. Quantum Electron., vol. 13, No. 4, pp. 451-455.

Belenov et al, Angular Distribution of the Luminescence Emitted by a Metal-Barrier-Metal Diode, May 1985, Sov. J. Quantum Electron., vol. 15, No. 5, pp. 735-737.

Belenov et al, Resonant Tunneling in Multilayer Structures in the Presence of Surface Electromagnetic Waves, Apr. 1986, Sov. Tech. Phys. Lett., vol. 12, No. 4, pp. 200-202.

Belenov et al, Emission of Surface Electromagnetic Waves in the Case of Resonance Tunneling of Electrons, Oct. 1987, Sov. J. Quantum Electron., vol. 17, No. 10, pp. 1348-1352.

Bykovskii et al, Influence of the Boundary of a Metal Film on the Luminescence Intensity from a Metal-Barrier-Metal Structure, Sov. Phys. Tech. Phys., Aug. 1986, vol. 31, No. 8, pp. 980-981.

Fumeaux et al., "Nanometer thin-film Ni-NiO-Ni diodes for mixing 28THz CO2-laser emissions with difference frequencies up to 176 GHz," Appl. Phys. B, 66, pp. 327-332 (1998).

Yasuoka et al., "Coupling to an "edge metal-oxide-metal" junction via an evaporated long antenna," Appl. Phys. Lett., 34, pp. 823-825 (1979).

Simon M. Sze, Physics of Semiconductor Devices, John Wiley & Sons, 2nd edition, 1981, Chapter 14.

J. Kuendig et al., "Thin-film silicon solar cells for space applications: Radiation hardness and applications for an integrated SOLANT (Solar cell—Antenna) module," 28th IEEE Photovoltaic Specialists Conference, Anchorage, Alaska, Sep. 2000.

N. A. Janunts et al, Modulation of Light Radiation during Input into Waveguide by Resonance Excitation of Surface Plasmons, Jul. 16, 2001, Applied Physics Letters, V 79, No. 3, p. 299-301.

Korotkov et al., "TASERS: Possible DC pumped terahertz lasers using interwell transitions in semiconductor heterostructures," Appl. Phys. Lett., vol. 65, No. 15, pp. 1865-1867 (1994).

H. Drexler et al, Photon-Assisted Tunneling in a Resonant Tunneling Diode: Stimulated Emission and Absorption in the THz Range, Nov. 6, 1995, Applied Physics Letters, V 67, No. 19, pp. 4102-4104.

K. Kempa et al, Towards Stimulated Generation of Coherent Plasmons in Nanostructures, Mar. 1, 1999, Journal of Applied Physics, V 85, No. 7, pp. 3708-3712.

M. Asada et al, Estimation of Interwell Terahertz Gain by Photon-assisted Tunneling Measurement in Triple-Barrier Resonant Tunneling Diodes, Jul. 31, 2000, Applied Physics Letters, V 77, No. 5, pp. 618-620.

A. Tredicucci et al, Surface Plasmon Quantum Cascade Lasers at ~µm, Oct. 9, 2000, Applied Physics Letters, V 77, No. 15, pp. 2286-2288.

R. Volkov et al, Tunneling-Assisted Photon Emission in MIM Junctions, Jun. 1991, Physics Stat Sol (b) 163.311.

A Aleksanyan et al, Feasibility of Developing a Tunable Oscillator Utilizing a System of Metal-Barrier-Metal-Barrier-Metal Junctions, May 11, 1981, Sov J Quan Elec, pp. 635-637.

E. Belenov et al, Investigation of the Radiation Emitted by Metal-Barrier-Metal Structures, Apr. 13, 1983, Sov Journal Quantum Electron, pp. 451-455.

D. Siu et al, Stimulated Electron Tunneling in Metal-Barrier-Metal Structures due to Surface Plasmons, Apr. 1, 1976, Applied Physics Letters, V 28, No. 7, pp. 407-410.

D. Drury et al, Theory of Infrared and Optical Frequency Amplification in Metal-Barrier-Metal Diodes, Jun. 1979, IEE Trans on Microwave Th and Tech, V MTT-27, No. 6, pp. 598-603.

D. Drury et al, A Stimulated Inelastic Tunneling Theory of Negative Differential Resistance in Metal-Insulator-Metal Diodes, Jan. 1980, IEEE J of Quan Elec, V QE-16, No. 1, pp. 58-69.

E. Belenov et al, Resonant Tunneling in Multilayer Structures in the Presence of Surface Electromagnetic Waves, Apr. 12, 1986, Sov Tech Phys Lett, pp. 200-202.

E. Belenov et al, Emission of Surface Electromagnetic Waves in the Case of Resonance Tunneling on Electrons, Oct. 17, 1987, Sov J Quantum Electron, pp. 1348-1352.

E. Belenov et al, Amplification of Surface Plasma Oscillations in Complex Metal-Barrier-Metal Structures, Jul. 12, 1982, Sov J Quantum Electron, pp. 930-931.

L Xie, Stimulated Emission of Surface Plasmons in Metal-Insulator-Metal (Transition Metal Type Like) Structures, May 1985, Infrared Phys, V 25, No. 5, pp. 661-664.

J. Schildkraut, Lon-Range Surface Plasmon Electrooptic Modulator, Nov. 1, 1988, Aplied Optics, V 27, No. 21, pp. 4587-4590.

C. A. Mead, "Tunnel-Emission Amplifiers," Proc. IRE, 48, 359 (1960).

Mordehai Heiblum, "Tunneling Hot Electron Transistor Amplifiers (THETA): Amplifiers Operating Up to the Infrared," Solid State Elec., 24, 343 (1981).

S. Muratake, M. Watanabe, T. Suemasu, and M. Asada, "Transistor action of metal (CoSi2)/insulator (CaF2) hot electron transistor structure," Elec. Lett., 28, 1002 (1992).

M. Heiblum, M. I. Nathan, D. C. Thomas, and C. M. Knoedler, "Direct Observation of Ballistic Transport in GaAs," Phys. Rev. Lett., 55, 2200 (1985).

A. Seabaugh, Y-C.Kao, J. Rndall, W. Frensely, A.Khatibzadeh, "Room Temperature Hot Electron Transistors with InAs-Notched Resonant-Tunneling-Diode Injector," Japanese Journal of Appl. Phys., 30, 921 (1991).

D. Lacour, M. Hehn, F. Montaigne, H. Jaffres, P. Rottlander, G. Rodaray, F.Ghuyen Van Dau, F. Petroff, A. Schuhl, "Hot-electron transport in 3-terminal devices based on magnetic tunnel junctions,"Europhysics Letters, 60, 896 (2002).

Satoshi Sugahara, Masaaki Tanaka, "Spin-Filter Transistor," Japanese Journal of Applied Physics, 43, L838 (2004).

John G. Simmons, "Generalized Formula for the Electric Tunnel Effect Between Similar Electrodes Separated by a Thin Insulating Film," J. Appl. Phys., 34, 1793 (1963).

R. Ludeke, H. J. Wen, and Andreas Schenk, "Quantum interference in SiO2: A conduction-band mass reappraisal," Appl. Phys. Lett., 73, 1221 (1998).

M. Heiblum, K. Seo, H.P. Meier, T. W. Hickmott, "First Observation of Ballistic Holes in a p-Type THETA Device," IEEE Trans. On Electron Devices, 35, 2428 (1988).

A. Otto, "Controlling a tunnel current from the exterior: A new mesoscopic quantum effect," *Europhysics Letters*, 62, 398 (2003).

John G. Simmons, Electric Tunnel Effect between Dissimilar Electrodes Separated by a Thin Insulating Film, Sep. 1993, Journal of Applied Physics, V34, p. 2581.

S. R. Pollack and C. E. Morris, Electron Tunneling through Asymmmetric Films of Thermally Grown $Al_2O_3$, May 1964, Journal of Applied Physics, V35, N5, p. 1503-1513.

\* cited by examiner

1000I

1000J

1000K

1000L

1000M

1000N

1000Q

1000R

1000S

1000T

1100A

1100B

1100C

1100D

1100E

1100F

1100G

1100H

1100I

THIN-FILM TRANSISTORS BASED ON TUNNELING STRUCTURES AND APPLICATIONS

RELATED APPLICATIONS

This application claims benefit of 60/565,700 filed on Apr. 26, 2004, and is a CIP of Ser. No. 10/877,874 filed on Jun. 26, 2004 U.S. Pat. No. 7,105,852 and is a continuation of Ser. No. 10/347,534 filed on Jan. 20, 2003 U.S. Pat. No. 6,756,649 which is continuation of Ser. No. 09/860,972 filed on May 21, 2001 U.S. Pat. 6,563,185.

The present application claims priority from U.S. Provisional Application Ser. No. 60/565,700 entitled PRACTICAL THIN-FILM TRANSISTORS BASED ON METAL-INSULATOR TUNNELING STRUCTURES AND THEIR APPLICATIONS, filed on Apr. 26, 2004. The present application is also a Continuation-in-Part of U.S. patent application Ser. No. 10/877,874, entitled HIGH SPEED ELECTRON TUNNELING DEVICES, filed on Jun. 26, 2004. The Ser. No. 10/877,874 Application is itself a Continuation of U.S. patent application Ser. No. 10/347,534, entitled HIGH SPEED ELECTRON TUNNELING DEVICES, filed on Jan. 20, 2003, which is itself a Continuation of U.S. patent application Ser. No. 09/860,972, entitled HIGH SPEED ELECTRON TUNNELING DEVICE AND APPLICATIONS, filed on May 21, 2001, all of which are incorporated herein by reference in their entirety.

BACKGROUND OF THE INVENTION

The present invention relates generally to transistors and, more particularly, to transistors based on tunneling structures and their applications.

Tunneling hot electron transistor amplifiers including a metal-insulator-metal-insulator-metal (M-I-M-I-M) configuration was first proposed by Mead in 1960[1] and analyzed in detail by Heiblum in 1981.[2] Turning now to the drawings, wherein like components are indicated by like reference numbers throughout the various figures where possible, attention is immediately directed to FIG. 1, an exemplary M-I-M-I-M transistor of the prior art is illustrated. It is noted that the figures are not drawn to scale for purposes of clarity.

FIG. 1 illustrates a partial cross sectional view of a typical M-I-M-I-M transistor, generally indicated by a reference numeral 100. M-I-M-I-M transistor 100 includes alternating single layers of metals and insulators, including an emitter electrode 110, a base electrode 112, a collector electrode 114, an emitter barrier 116, and a collector barrier 118.

Other researchers have investigated similar transistor structures using epitaxial metal-insulator structures[3], III–V semiconductor structures[4a,4b], and structures using ferromagnetic metals[4c] and insulators[4d].

Additionally, in many circuit applications, it is advantageous to have complementary pairs of transistors such that one transistor turns on with positive base-emitter voltage and another, complementary, transistor turns on with negative base-emitter voltage. In this way, a push-pull amplifier or switch circuits may be built. Examples of such devices include silicon CMOS or bipolar push-pull power amplifiers, which use relatively low quiescent power.

Prior art hot hole transistors[8] have the same M-I-M-I-M as the previously described hot electron transistors. Device operation is also similar, with the exception that holes, instead of electrons, are the charge carriers in the device. However, the hot hole transistors of the prior art share the same problems as in prior art M-I-M-I-M hot electron transistors.

As will be seen hereinafter, the present invention provides a remarkable improvement over the prior art as discussed above by virtue of its ability to provide fast thin-film devices with increased performance while resolving the aforedescribed problems present in the current state of the art.

SUMMARY OF THE INVENTION

As will be described in more detail hereinafter, there is disclosed herein a hot electron transistor adapted for receiving at least one input signal. The transistor includes an emitter electrode and a base electrode spaced apart from the emitter electrode such that at least a portion of the input signal may be applied across the emitter and base electrodes and, consequently, electrons are emitted from the emitter electrode toward the base electrode. The transistor also includes a first tunneling structure disposed between the emitter and base electrodes and configured to serve as a transport of electrons between and to the emitter and base electrodes. The first tunneling structure includes at least a first amorphous insulating layer and a different, second insulating layer disposed directly adjacent to and configured to cooperate with the first amorphous insulating layer such that the transport of electrons includes, at least in part, transport by means of tunneling. The transistor further includes a collector electrode, spaced apart from the base electrode, and a second tunneling structure between the base and collector electrodes. The second tunneling structure is configured to serve as a transport, between the base and collector electrodes, of at least a portion of the electrons emitted from the emitter electrode by means of ballistic transport such that the portion of the electrons is collected at the collector electrode. The input signal may include, for example, bias voltage, signal voltage, or electromagnetic radiation.

In another aspect of the present invention, the transistor at least a selected one of the base and collector electrodes is formed, at least in part, of a semi-metal. Alternatively, a selected one of the base and collector electrodes is formed of a metal-silicide or a metal-nitride.

In still another aspect of the invention, the second tunneling structure is configured to exhibit a first value of hot electron reflection, and wherein the second tunneling structure includes a shaped barrier energy band characteristic such that the first value of hot electron reflection is lower than a second value of hot electron reflection that would be exhibited by the second tunneling structure without the shaped barrier energy band characteristic. More specifically, the shaped barrier energy band characteristic includes a parabolic grading of the second tunneling structure.

In another aspect of the invention, the transistor is configured to exhibit a first value of electron emission energy width, and wherein the first tunneling structure includes a shaped barrier energy band characteristic such that the first value of electron emission energy width is lower than a second value of electron emission energy width that would be exhibited by the transistor without the shaped barrier energy band characteristic.

In yet another aspect of the invention, the emitter electrode is configured to exhibit a given Fermi level, and the first tunneling structure is configured to exhibit a given conduction band such that the given conduction band differs from the given Fermi level by less than 2 eV.

In a further aspect of the invention, a hot hole transistor adapted for receiving at least one input signal is disclosed. The hot hole transistor includes an emitter electrode and a base electrode spaced apart from the emitter electrode such that at least a portion of the input signal may be applied across the emitter and base electrodes and, consequently, holes are emitted from the emitter electrode toward the base electrode. The hot hole transistor also includes a first tunneling structure disposed between the emitter and base electrodes, and configured to serve as a transport of holes between and to the emitter and base electrodes. The first tunneling structure includes at least a first amorphous insulating layer and a different, second insulating layer disposed directly adjacent to and configured to cooperate with the first amorphous insulating layer such that the transport of holes includes, at least in part, transport by means of tunneling. The hot hole transistor further includes a collector electrode spaced apart from the base electrode, and a second tunneling structure disposed between the base and collector electrodes and configured to serve as a transport, between the base and collector electrodes, of at least a portion of the hot holes emitted by the emitter electrode by means of ballistic transport such that the portion of the holes is collected by the collector electrode.

In another aspect of the invention, a method for use in a hot electron transistor including a plurality of layer with a plurality of interfaces defined therebetween and ballistic electrons being transported therebetween is disclosed. The plurality of layers includes at least a first layer and a second layer adjacent and juxtaposed to each other and defining a first interface therebetween such that at least a portion of the ballistic electrons may be reflected at the first interface. The method for reducing electron reflection at at least the first interface includes configuring the first layer to exhibit a first, selected wave function, and configuring the second layer to exhibit a second, selected wave function such that a first fraction of the ballistic electrons is reflected at the first interface. This first fraction is smaller than a second fraction of the ballistic electrons that would be reflected at the first interface without the second layer being configured to exhibit the second, selected wave function.

In still another aspect of the invention, a transistor adapted for receiving at least one input signal is disclosed. The transistor includes an emitter electrode and a base electrode spaced apart from the emitter electrode such that at least a portion of the input signal may be applied across the emitter and base electrodes and, consequently, electrons are emitted from the emitter electrode toward the base electrode. The transistor also includes a first tunneling structure disposed between the emitter and base electrodes and configured to serve as a transport of electrons between and to the emitter and base electrodes. The transistor further includes a collector electrode spaced apart from the base electrode, and a second tunneling structure disposed between the base and collector electrodes, and configured to serve as a transport, between the base and collector electrodes, of at least a portion of the electrons emitted by the emitter electrode by means of ballistic transport such that the portion of the electrons is collectable at the collector electrode. The second tunneling structure is configured to exhibit a first value of hot electron reflection, and the second tunneling structure is further configured to exhibit a selected wave function such that the first value of hot electron reflection is lower than a second value of hot electron reflection that would be exhibited by the second tunneling structure without the selected wave function.

In yet another aspect of the invention, a linear amplifier adapted for receiving at least one input signal is disclosed. The linear amplifier includes a hot electron transistor, which in turn includes a first emitter electrode and a first base electrode spaced apart from the first emitter electrode such that at least a first portion of the input signal may be applied across the first emitter and first base electrodes and, consequently, electrons are emitted from the first emitter electrode toward the first base electrode. The hot electron transistor also includes a first tunneling structure disposed between the first emitter and first base electrodes and configured to serve as a transport of electrons between and to the first emitter and first base electrodes. The first tunneling structure includes at least a first amorphous insulating layer and a different, second insulating layer disposed directly adjacent to and configured to cooperate with the first amorphous insulating layer such that the transport of electrons includes, at least in part, transport by means of tunneling. The hot electron transistor further includes a first collector electrode spaced apart from the first base electrode, and a second tunneling structure disposed between the first base and first collector electrodes and configured to serve as a transport, between the first base and first collector electrodes, of at least a portion of the electrons emitted from the first emitter electrode by means of ballistic transport such that the portion of the electrons is collectable at the first collector electrode. The linear amplifier also includes a hot hole transistor, which in turn includes a second emitter electrode and a second base electrode spaced apart from the second emitter electrode such that at least a second portion of the input signal may be applied across the second emitter and second base electrodes and, consequently, holes are emitted from the second emitter electrode toward the second base electrode. The hot hole transistor also includes a third tunneling structure disposed between the second emitter and second base electrodes and configured to serve as a transport of holes between and to the second emitter and second base electrodes. The third tunneling structure includes at least a third amorphous insulating layer and a different, fourth insulating layer disposed directly adjacent to and configured to cooperate with the third amorphous insulating layer such that the transport of holes includes, at least in part, transport by means of tunneling. The hot hole transistor further includes a second collector electrode spaced apart from the second base electrode, and a fourth tunneling structure disposed between the second base and second collector electrodes and configured to serve as a transport, between the second base and second collector electrodes, of at least a portion of the hot holes emitted by the second emitter electrode by means of ballistic transport such that the portion of the holes is collectable at the second collector electrode. In the linear amplifier, the hot electron transistor and the hot hole transistor are configured in a push-pull amplifier configuration.

BRIEF DESCRIPTION OF THE DRAWINGS

The present invention may be understood by reference to the following detailed description taken in conjunction with the drawings briefly described below. It is noted that, for purposes of illustrative clarity, certain elements in the drawings may not be drawn to scale. Furthermore, descriptive nomenclature such as, for example, vertical, horizontal and the like applied to the various figures is used for illustrative purposes only and is in no way intended as limiting useful orientations of the structure or device described.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

While the M-I-M-I-M thin film transistor structure has been analyzed since around 1960, a commercially useful device has not been demonstrated by others to date. Recent advancements in the state of materials processing and understanding, device fabrication and device modeling techniques contribute positively to the possibility of achieving a well-controlled M-I-M-I-M thin-film transistor and understanding its operation. Furthermore, the innovations developed by the assignee of the present application further enable additional advancements over the prior art M-I-M-I-M thin-film transistor, as will be discussed in detail immediately hereinafter.

Improvements to the Tunneling Hot Electron Transistor

In the present disclosure, we discuss key innovations to the thin film hot electron transistor structure, which we submit separate our device from the largely unsuccessful prior art devices and make the present device a feasible thin film transistor. Additionally, several possible enhancements are considered.

The use of a double insulator (i.e., I—I) structure in a thin film metal-insulator structure has been discussed in detail in, for example, U.S. Pat. No. 6,534,784 entitled METAL-OXIDE ELECTRON TUNNELING DEVICE FOR SOLAR ENERGY CONVERSION (hereinafter, the '784 patent), which is assigned to the assignee of the present application and incorporated herein by reference. The inclusion of an I—I configuration in the emitter barrier solves at least two problems. First, since the I—I structure results in a tunnel junction having significantly greater nonlinearity than a single insulator tunnel junction, the result is higher differential conductivity (for high speed) at lower DC bias current (for high efficiency and lower noise). Additionally, if charge storage at the insulator-insulator interface is avoided, the emitter-base capacitance may also be reduced by using two insulator layers. Secondly, the distribution of hot electrons emitted into the base is much narrower in energy than that from a single-insulator tunnel junction, thereby resulting in higher current gain.

Figure 1:
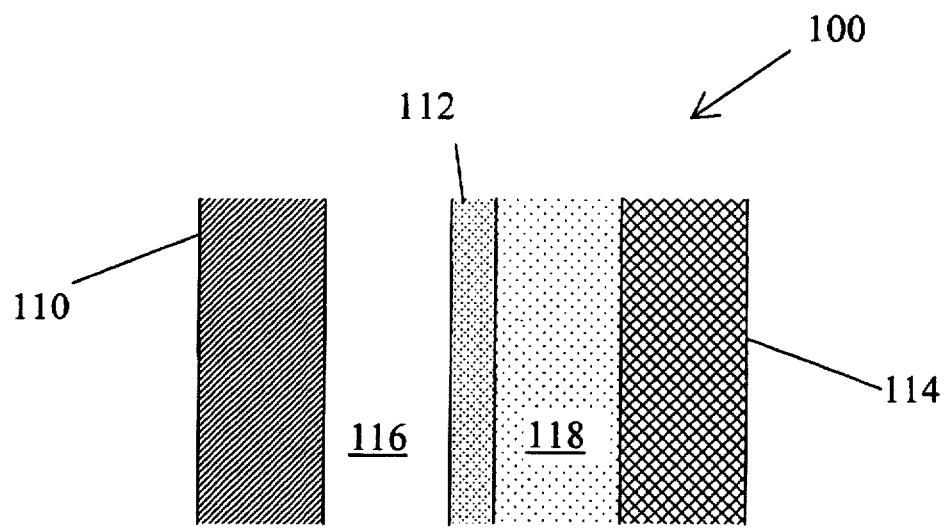
FIG. 1 is a diagrammatic view, in partial cross section, of a junction transistor device as disclosed in the aforementioned '185 patent.

In U.S. Pat. No. 6,563,185 entitled HIGH SPEED ELECTRON TUNNELING DEVICE AND APPLICATIONS (hereinafter, the '185 patent), which is assigned to the assignee of the present application and incorporated herein by reference, a junction transistor having a structure including a multilayer tunneling structure as one or both of the I-layers in the M-I-M-I-M transistor of FIG. 1 was disclosed. That is, in the case of a junction transistor, emitter barrier 116 and/or collector barrier 118 includes a multilayer tunneling structure. As known to one skilled in the art, junction transistors use bias voltages or currents from an external bias source (not shown) to set the operating point of the transistor and power to drive the output. These external bias sources are configured to apply voltage, for example, in a common emitter configuration, as a potential at the base-emitter junction and/or as a potential at the collector-emitter junction. For instance, a bias source may be used to apply a voltage across the emitter and base electrodes to control the potential in emitter barrier 116 and, consequently, the tunneling probability of electrons from emitter electrode 110 to base electrode 112. Once emitted, electrons tunnel through emitter barrier 116, base electrode 112, collector barrier 118 and finally into collector electrode 114 with a given value of collection efficiency. The collection efficiency is a function of the fraction of electrons that tunnel unimpeded through base electrode 112. The tunneling probability is determined by the applied voltage at the base, along with other material properties.

Figure 2:
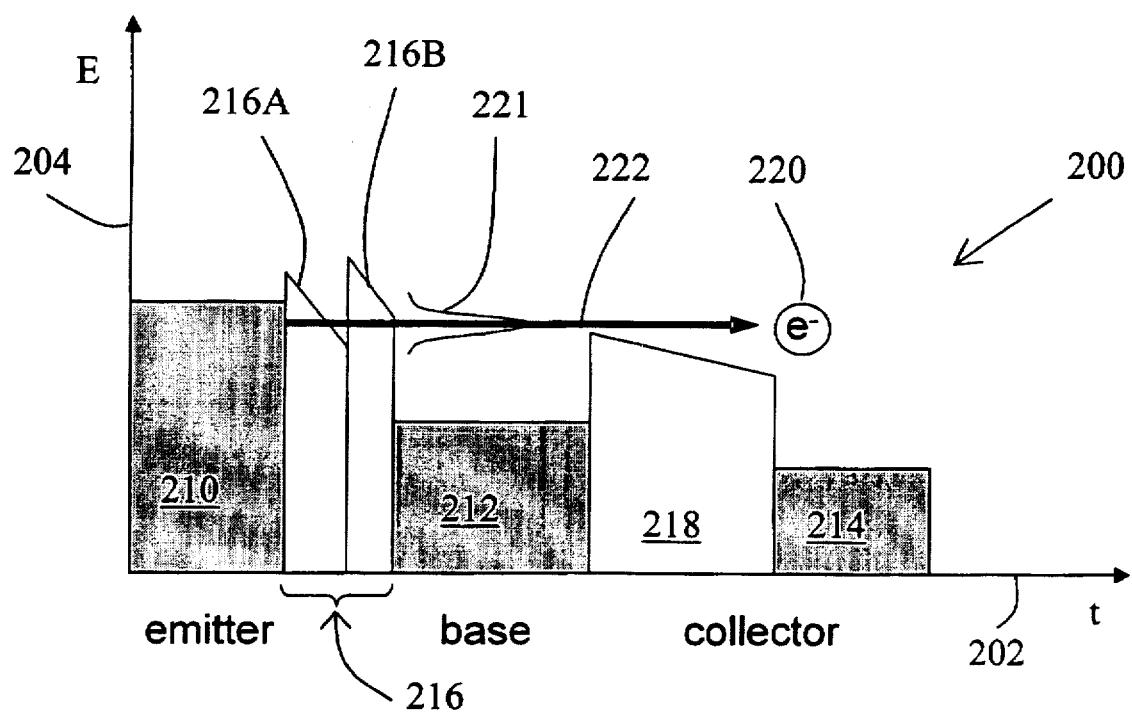
FIG. 2 is an energy band diagram corresponding to a hot electron transistor of the present invention.

One example of such a junction transistor, including a double-insulator structure in the emitter barrier, is illustrated in FIG. 2. The N-I-I-N-I-N (where N=non-insulating layer and I=insulating layer, in general) transistor, the energy band diagram of which is shown in FIG. 2, is an enhancement of the prior art M-I-M-I-M tunneling hot electron transistor structure. In the N-I-I-N-I-N transistor, the emitter tunnel junction injects hot electrons into the base. The electrons travel across the thin metal base by ballistic transport. Ballistic transport is understood to be the motion (e.g., of electrons) with velocities higher than their equilibrium thermal velocity which are not subject to scattering. In contrast, resonant tunneling is the motion of an electron through a quasi-stationary energy level.

If the injected electrons have sufficient energy to surmount the collector barrier, they proceed on their ballistic path until they reach the collector metal. On the other hand, relatively cold electrons in the base, which control the base-emitter potential, do not have sufficient energy to surmount the collector barrier. Transistor current gain is determined by the ratio of emitter-to-collector hot electron current to base current. As disclosed in the '185 and '784 patents, the N-layers may be formed of a variety of materials such as, but not limited to, metals, semi-metals, metal-silicides and metal-nitrides.

Continuing to refer to FIG. 2, an energy band diagram 200 corresponding to an N-I-I-N-I-N hot electron transistor structure is illustrated. Energy band diagram 200 includes an x-axis 202 (indicating thin-film stack thickness t) and a y-axis 204 (indicating energy E). The various portions of energy band diagram 200 of the N-I-I-N-I-N hot electron transistor structure corresponds to an emitter electrode 210, a base electrode 212, a collector electrode 214, an emitter barrier structure 216 and a collector barrier structure 218. Emitter barrier structure 216 includes a first insulating layer 216A and a second insulating layer 216B. That is, emitter electrode 210, base electrode 212 and collector electrode 214 correspond to the "N" layers in the N-I-I-N-I-N hot electron transistor structure, while first insulating layer 216A and second insulating layer 216B in emitter barrier structure 216 and collector barrier structure 218 correspond to the "I" layers in the N-I-I-N-I-N hot electron transistor structure. A bias voltage (not shown) applied between emitter electrode 210 and base electrode 212 causes the emission of ballistic electrons 220 from emitter electrode 210 with an electron energy distribution 221, indicated by a peaked curve centered around an energy level 222, indicated by an arrow. The use of the double-insulator structure (i.e., first insulating layer 216A and second insulating layer 216B) in the transistor structure represented by energy band diagram 200 leads to, for example, a narrowing of the peak width of electron energy distribution 221, thereby increasing the efficiency of the transistor.

Furthermore, a semi-metal material, a metal-silicide, or a metal-nitride, may be used to form one or both of the base electrode and the collector electrode. Metal-silicides, for example, such as cobalt silicide ($CoSi_2$) and tungsten silicide ($WSi_2$) are semi-metallic in that their conductivities and carrier concentrations are between those of a metal and a semiconductor. Semi-metals present a trade-off between high base conductivity and high current gain.

Another feature which may help improve the characteristics of a thin-film transistor is the shaping of one or both of the emitter barrier and the collector barrier. The barrier may be shaped by grading the electronic characteristics of the thin-film on one or both sides such that an electron traveling through the transistor device will encounter a shaped energy band. For instance, a shaped barrier may be achieved by varying factors such as composition, electron affinity, charge neutrality level, electron mass and dielectric constant during formation of the barrier. A rounded collector barrier, for example, reduces the reflection of hot electrons at the interfaces between the electrodes and the barrier. Also, a shaped emitter barrier leads to the narrowing of the electron emission width from the emitter electrode toward the base electrode.

Still another improvement to the thin-film transistor is the use of low barriers in one or both of the emitter and collector barriers. The use of low barriers, in contrast to the high barriers used in prior art thin-film transistors, result in both high conductivity (for high speed) and low scattering rates of hot electrons (for high gain).

The N-I-I-N-I-N transistor of the present invention presents a variety of advantages over the prior art. The N-I-I-N-I-N transistor is a thin-film device which may be formed without the use of semiconductors and epitaxy. For example, the N-I-I-N-I-N transistor may be formed entirely of metals and insulators (i.e., as a M-I-I-M-I-M structure) such that the transistor may be formed on a variety of substrates. Deposition and processing temperatures of the N-I-I-N-I-N transistor are low (e.g., typically below 250° C.) such that the N-I-I-N-I-N transistor is compatible with substrates that do not tolerate high temperature processing, such as flexible polymer substrates. Also, the N-I-I-N-I-N is a fast device, with cut-off frequencies ($f_T$) that may extend into the terahertz range.

Figure 4A:
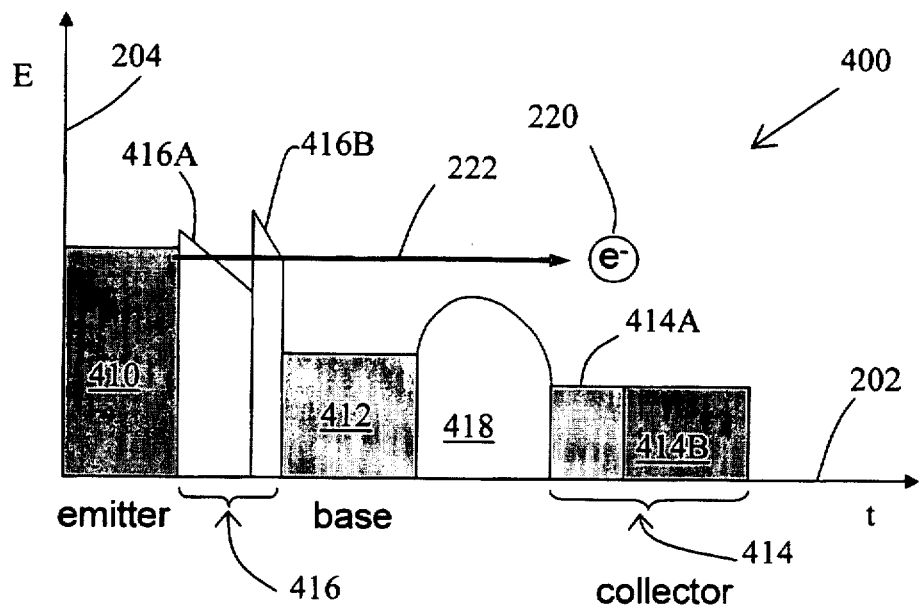
FIG. 4A is an energy band diagram corresponding to another embodiment of a hot electron transistor of the present invention.
Figure 4B:
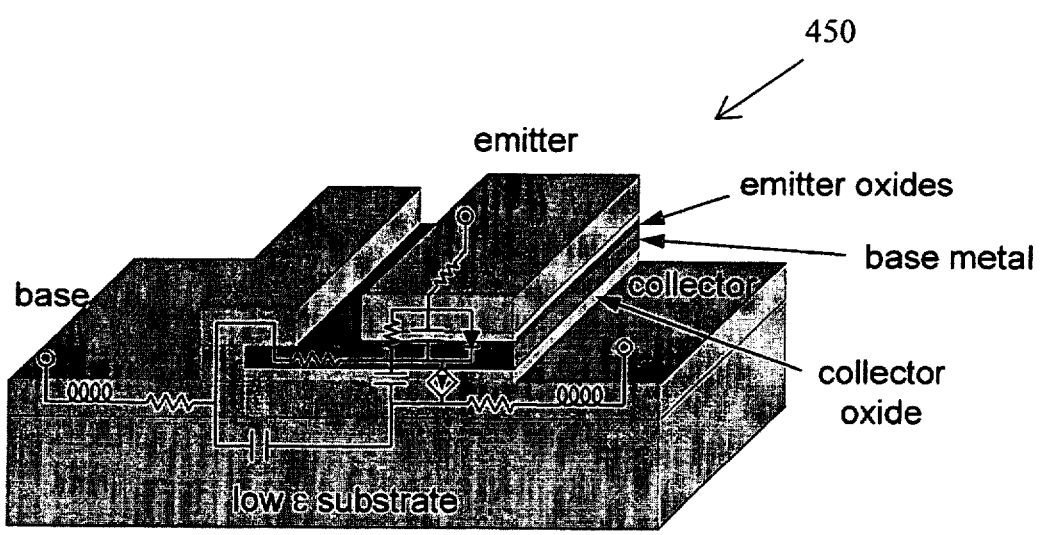
FIG. 4B is a diagrammatic view, in partial elevation, of a hot electron transistor of the present invention, along with an equivalent circuit diagram superimposed thereon.

Referring now to FIGS. 4A and 4B, the structure of the N-I-I-N-I-N tunneling hot electron transistor of the present invention is described. FIG. 4A shows an energy band diagram 400 corresponding to an improved N-I-I-N-I-N tunneling hot electron transistor of the present invention. Energy band diagram 400 includes energy band levels for an emitter electrode 410, a base electrode 412, a collector electrode structure 414, an emitter barrier structure 416, and a collector barrier structure 418. Emitter barrier structure includes a double-insulator configuration, including a first insulating layer 416A and a second insulating layer 416B. Base electrode 412 is formed of a metal-silicide. Furthermore, collector electrode structure 414 includes a metal-silicide layer 414A and a metal layer 414B. A diagrammatic view, in partial elevation, of a N-I-I-N-I-N tunneling hot electron transistor 450 (and the equivalent circuit diagram) corresponding to energy band diagram, is shown in FIG. 4B.

The N-I-I-N-I-N tunneling hot electron transistor, represented by energy band diagram 400 in FIG. 4A and diagrammatic view 450 in FIG. 4B, embodies the various improvements provided by the present invention over the prior art. A variety of factors contribute to the improvements in this N-I-I-N-I-N transistor.

Compared with semiconductor transistors, the response of the transistor structure of FIG. 4B is fast due to: 1) the thinness of the films and active junction regions, leading to short carrier transit times; 2) the use of metallic or semi-metallic conductive layers up to and within the device, leading to lower series resistance, particularly in the thin base layer and particularly at frequencies above a few hundred gigahertz; 3) the use of a high differential conductivity N-I-I-N emitter structure, leading to low emitter resistance and high transimpedance gain; and 4) the use of low dielectric-constant substrate materials, resulting in lower parasitic substrate capacitance. Due to the thinness of the films included in the N-I-I-N-I-N transistor, the tunneling time through the emitter barrier is on the order of one femtosecond. Furthermore, ballistic transport of hot electrons across base electrode 412 (~10 nm thick) and collector barrier structure 418 (~8 nm thick) is on the order of 0.1 picosecond or less. In the N-I-I-N-I-N transistor shown in FIGS. 4A and 4B, high conductivity metal leads extend all the way up to the junctions, thereby greatly reducing parasitic resistance, in comparison to semiconductor devices, and leading to a high maximum oscillation frequency ($f_{max}$). Also, it is known that the high frequency conductivity through a particular material is limited by the plasma frequency of the material. Whereas the plasma frequency of a semiconductor is on the order of one terahertz at most, the plasma frequency of metals is in the ultraviolet range, such that the high frequency conductivity of the electrode layers in the N-I-I-N-I-N transistor is much higher than that of a semiconductor device. Additionally, the use of the double-insulator configuration in the emitter barrier allows high differential conductivity for high transconductance gain at relatively low DC bias currents, thereby resulting in a high cut-off frequency $f_T$ (Details of the double-insulator configuration are disclosed, for example, in the '784 patent). Moreover, while commonly used semiconductor substrates are known to exhibit high dielectric constants, since the N-I-I-N-I-N transistor is compatible with a variety of substrates, the N-I-I-N-I-N transistor may be fabricated onto low dielectric constant substrates, thus minimizing parasitic capacitances.

Compared with prior art M-I-M-I-M and other hot electron transistors, the transistor of FIG. 4A incorporates several improvements in current gain performance. First, the shaped characteristic of the collector barrier portion of energy band diagram 400 helps reduce electron reflection at the base electrode—collector barrier—collector electrode structure interfaces. In addition, the semi-metallic base and collector layers (labeled in FIG. 4A as metal silicides) also reduce electron reflections at these interfaces when compared with normal metal layers. Second, the M-I-I-M tunnel emitter exhibits higher differential conductivity and a narrower energy spread of emitted electrons than a simple M-I-M emitter structure. Third, low barrier heights between the metal Fermi energy levels and the conduction band edges of the insulators reduces electron reflections and inelastic electron scattering. The details of the aforedescribed improvement factors are discussed immediately hereinafter.

Certain important recognitions by Applicants have led to the development of the improved thin-film transistor. In particular, Applicants have recognized and thoroughly analyzed the physics of the gain-limiting processes in thin-film transistors based on combinations of non-insulating and insulating layers, as well as ways to over come these gain-limiting mechanisms. It is recognized that current gain in the hot electron transistor is limited by four mechanisms: 1) hot electron scattering in the base electrode; 2) base-collector leakage current; 3) energy spread of injected hot electron distribution; and 4) quantum mechanical reflections at the electrode-barrier interfaces.

Figure 5:
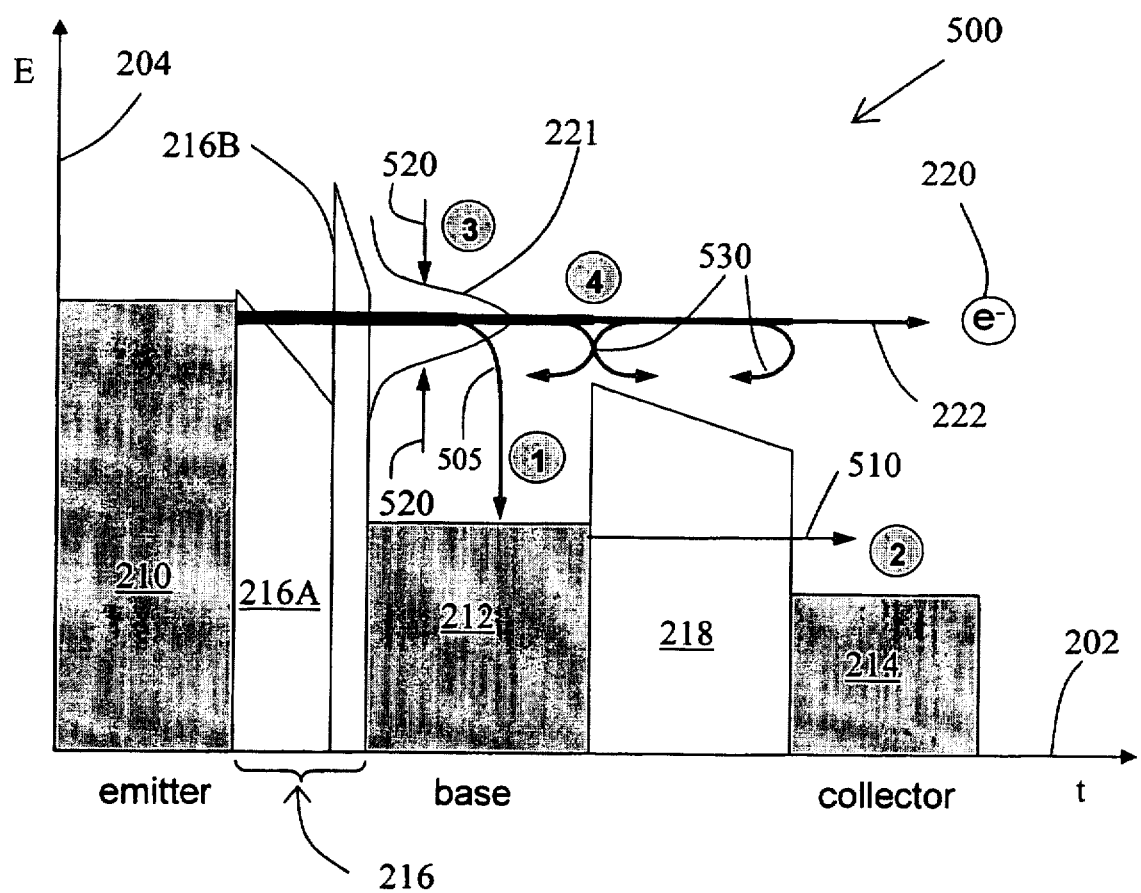
FIG. 5 is an energy band diagram corresponding to an embodiment of a hot electron transistor of the present invention, shown here to indicate a variety of gain limiting mechanisms that are to be overcome in order to attain a useful device.

Each of these four mechanisms are discussed in reference to FIG. 5 in conjunction with FIG. 2. FIG. 5 includes the components of energy band diagram 200 of the N-I-I-N-I-N hot electron transistor from FIG. 2, along with the four aforementioned gain limiting mechanisms. The gain limiting mechanisms shown in FIG. 5 include hot electron scattering effect 505 in the base (indicated by a downward arrow and a number 1 in a circle), base-collector leakage current 510 (indicated by a horizontal arrow and a number 2 in a circle), energy spread of injected hot electron distribution 520 (indicated by a pair of arrows on either side of electron energy distribution curve 221 and a number 3 in a circle) and quantum mechanical reflections 530 at the electrode-barrier interfaces (indicated Hot electron scattering 505 in the base electrode is the inelastic scattering due to electron-electron interactions and electron-phonon interactions. Such inelastic scattering reduces the number of hot electrons with sufficient energy to surmount the collector barrier. As is known, scattering probability increases rapidly with increasing electron energy above the Fermi level.

This problem of hot electron scattering may be overcome by the use of low tunneling barriers (e.g., 2 eV or lower), such as niobium (Nb)—niobium pentoxide ($Nb_2O_5$), tantalum (Ta)—titanium oxide ($TiO_2$) and Ta—tantalum oxide ($Ta_2O_5$), and by the use of a semi-metallic base electrode, such as a metal silicide. Prior art M-I-M-I-M structures used high barrier oxides, such as aluminum oxide ($Al_2O_3$), which severely limits, if not completely quench, current gain. The probability that the injected hot electron will cross the base electrode ballistically without scattering is given by the base transport factor, $\alpha_B$:

$$\alpha_B = \exp\left(-\frac{x_B}{L_B} V_e^2\right), \tag{1}$$

where $x_B$ is the base electrode thickness, $L_B$ is the mean free path in the material forming the base electrode (in units of nm/eV$^2$) and $V_e$ is the hot electron energy above the Fermi level. Typical values for $L_B$ in metal are on the order of 20 nm/eV$^{24}$. Therefore, a 0.3 eV hot electron traversing a 10 nm base electrode, for example, would have a base transport factor of approximately $\alpha_B \sim 0.14$. While Applicants are not aware of any published data regarding hot electron scattering lengths in semi-metals, it is submitted that the scattering lengths for semi-metals would be longer than those in conventional metals due to the lower free electron concentration (~$10^{22}$ cm) in semi-metals in comparison to metals. Electron-phonon scattering and defect scattering rates have not been explored in semi-metals, and further experimental exploration should quantify the aforedescribed effects.

The second problem of base-collector leakage current 510 (or dark current) arises from the fact that, if the collector barrier energy band height is too low, then cold electrons in the base electrode may tunnel through the collector barrier to the collector electrode, or vice versa. This extraneous tunneling current constitutes base-collector leakage current and leads to reduction of transistor current gain.

The base-collector leakage current problem may be overcome by appropriate selection of collector barrier energy band height, width and shape. Selection of collector barrier energy band height is a trade-off between reducing hot electron scattering (requiring low barrier height) and reducing base-collector tunneling current (requiring high barrier height). Using device models, Applicants have found that collector barriers having an energy band height in the range 0.3 to 0.8 eV results in a good trade-off between these two competing factors. Also, the base-collector leakage current problem may be naturally alleviated by the use of a lower collector barrier energy band height, as discussed earlier in reference to the hot electron scattering problem, since the quantum-mechanical image force may be enhanced by using materials with low dielectric constants.

Similarly, selection of collector barrier energy band thickness is a tradeoff between device speed and leakage current. Thicker barriers would yield lower leakage current, but the transport time of the ballistic electron across the barrier would also increase. That is, a hot electron traveling at a ballistic velocity between $10^7$–$10^8$ cm/s would take longer to traverse a 20 nm barrier than it would take to traverse a 5 nm barrier. A further problem is if the ballistic electron scatters and thermalizes down to the conduction band edge of the barrier. Since the barriers used in the devices of the present invention have generally included amorphous materials, the mobility for electron conduction (i.e., drift and diffusion) is very low. Consequently, the time for a given electron to reach the collector electrode would increase significantly if the electron thermalizes. Therefore, barrier thickness should be selected to minimize the probability of thermalizing collisions.

Furthermore, collector barrier energy band shape has a strong influence on hot electron transmission probability. Likewise, barrier energy band shape affects base-collector leakage current as the effective barrier energy band height is approximately equal to the mean barrier energy band height.[5,56] Therefore, leakage current should also be considered when selecting an appropriate barrier energy band shape for hot electron transmission, which will be discussed in further detail at an appropriate point in the disclosure below.

The third problem of energy spread 520 of injected hot electron distribution is due to the fact that electrons tunneling through the emitter barrier are not mono-energetic. That is, the electrons emerging from the emitter barrier are hot electrons with a spread of energies. Since very hot (i.e., high energy) electrons have a much greater probability of inelastic scattering while relatively cold (i.e., low energy) electrons have a low probability of clearing the collector barrier, the result is a reduced transistor gain.

Figure 6B:
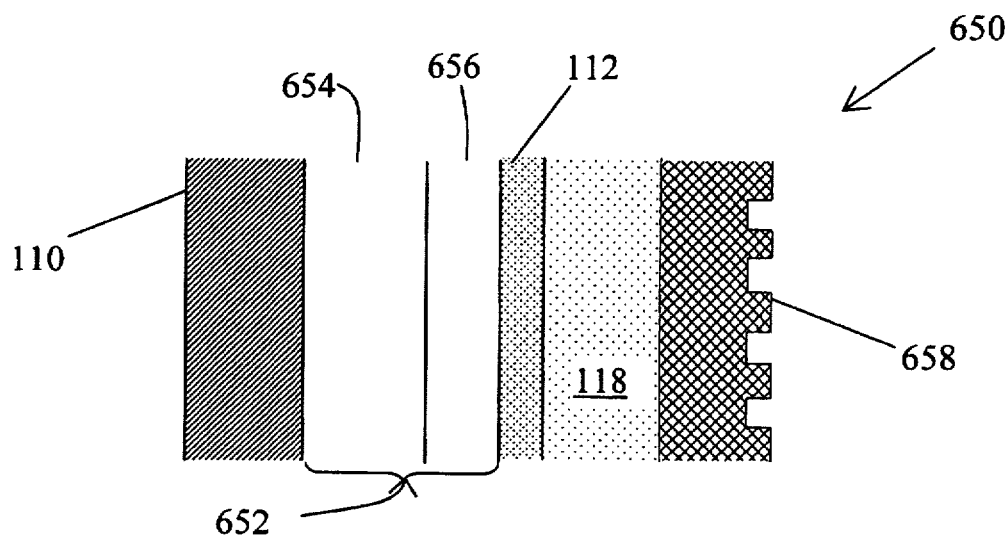
FIG. 6B is a diagrammatic view, in partial cross section, of a transistor device in accordance with the present invention including a double-insulator structure emitter barrier and a textured collector electrode.
Figure 6A:
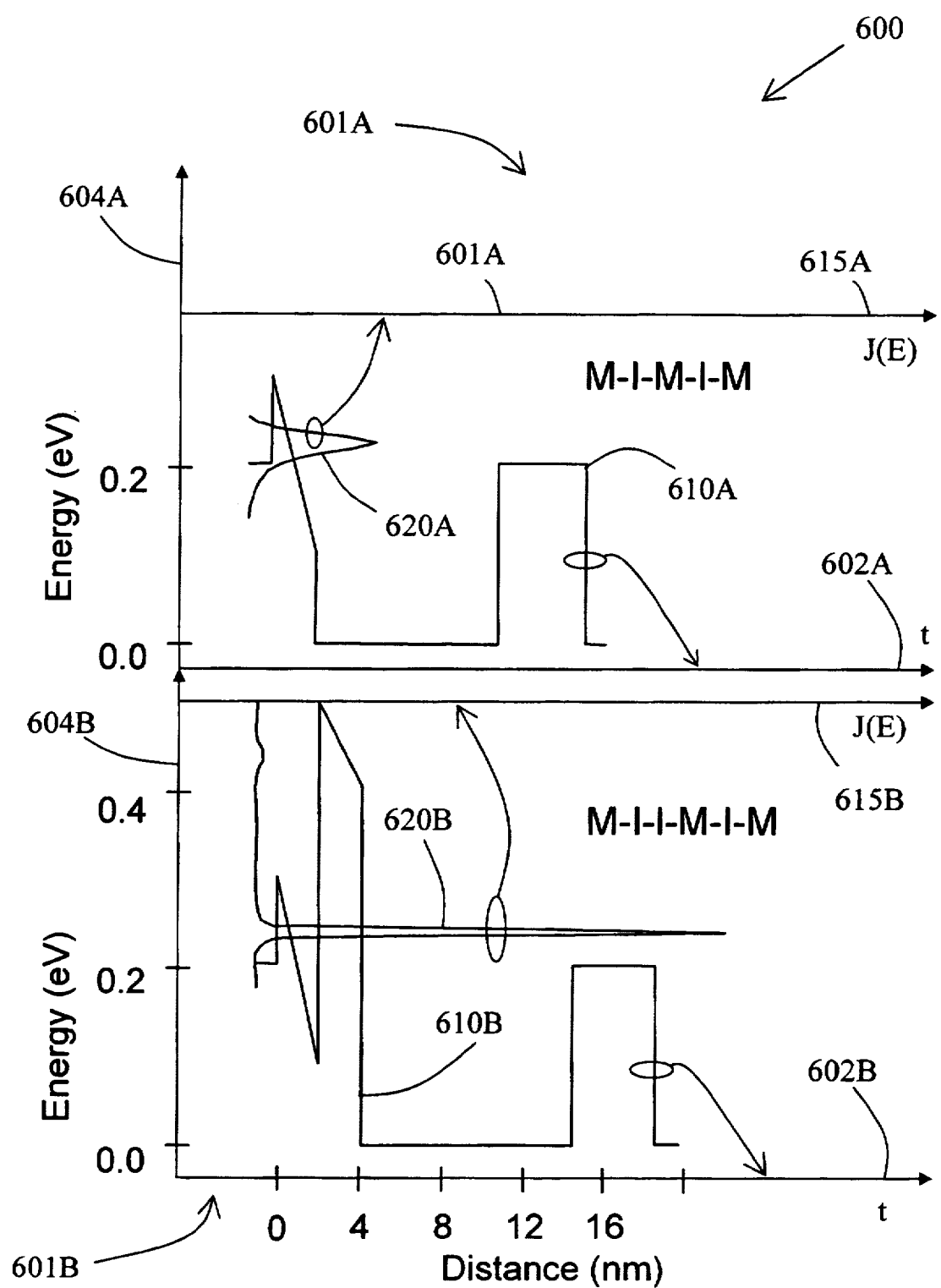
FIG. 6A is a comparison of two energy band diagrams, shown here to compare and contrast the effect of the inclusion of a double-insulator structure on the electron energy distribution of the electrons emitted from the emitter barrier in comparison to that of a single-insulator structure.

The hot electron energy spread may be addressed through the inclusion of a double-insulator configuration in the emitter barrier. Details of a variety of double-insulator configurations have been discussed in detail in the '784 patent and the '185 patent. The narrowing of the emitted electron distribution is illustrated in FIG. 6A, in which the theoretical hot electron distribution from a single insulator emitter is compared with that of an emitter including a double-insulator configuration. FIG. 6A shows a comparison of the energy distribution of hot electrons injected from a single-insulator M-I-M emitter and a double-insulator M-I-I-M emitter. FIG. 6A includes a composite graph 600 including a first graph 601A and a second graph 601B. The top portion of graph 600 includes a first x-axis 602A, corresponding to distance, and a y-axis 604A, corresponding to energy, for an energy band diagram 610A of a single-insulator M-I-M emitter. Y-axis 604A and a second x-axis 615A, corresponding to current, are the axes for a current versus energy distribution curve 620A. Similarly, the bottom portion of graph 600 includes a first x-axis 602B, corresponding to distance, and a y-axis 604B, corresponding to energy, for an energy band diagram 610B of a double-insulator M-I-I-M emitter, with a corresponding, current versus energy distribution curve 620B indicated on y-axis 604B and a second x-axis 615B. As may be seen by comparing current versus energy distribution curves 620A and 620B, the double-insulator configuration in the emitter yields a much narrower peak of current/energy distribution. The narrower distribution of hot electrons from the emitter with a double-insulator structure included therein results in increased current gain.

Continuing to refer to FIG. 6A, the narrow electron distribution resulting from the emitter including the double-insulator configuration may also be useful in some of the non-traditional applications of the N-I-I-N-I-N transistor, such as in frequency multipliers and short pulse generators. The N-I-I-N diode configuration offers an additional benefit of low currents in reverse bias, which may be useful in switching applications. The low currents in reverse bias may be further enhanced by using a thin textured emitter metal, which may be formed, for example, by sputtering at high pressures and low cathode voltages. An example of such a textured collector electrode is shown in FIG. 6B, illustrating a transistor 650 including a double-insulator emitter barrier (with first and second insulator layers 654 and 656, respectively), wherein a collector electrode 658 is shown to include a step-like texture on the side away from collector barrier 118.

The fourth problem of quantum mechanical reflections 530 of hot electrons at non-insulator—insulator interfaces may be the most challenging of the four gain-limiting mechanisms to overcome.[6] Ludeke et al. have experimentally observed the oscillatory transmission of hot electrons in palladium (Pd)—silicon dioxide (SiO2)—silicon (Si) structures.[7] In general, Applicants have recognized that the reduction of the quantum mechanical reflection problem requires the reduction of the wave function contrast across the thin-film transistor device. Applicants submit a two-prong approach to solving this critical problem, as will be discussed in detail immediately hereinafter.

The first approach is based on the use of semi-metallic base and collector electrodes. In order to minimize the wave function contrast between the base and collector electrodes and the collector barrier, the energy difference between the conduction band edge in the electrodes (at E eV below the Fermi level) and that in the insulator (at the top of the collector barrier). A typical metal, such as aluminum or copper, has a conduction band edge on the order of 10 eV below the Fermi level. Certain other metals, such as niobium and silver, have conduction band edges on the order of 5 eV below the Fermi level, thus making these metals more preferable for use in the transistor of the present invention. Moreover, since metal-silicides have carrier concentrations of ~$10^{22}$ cm$^{-3}$, this information may be extrapolated to predict that metal-silicides have conduction band depths of only 1 to 2 eV.

Figure 7:
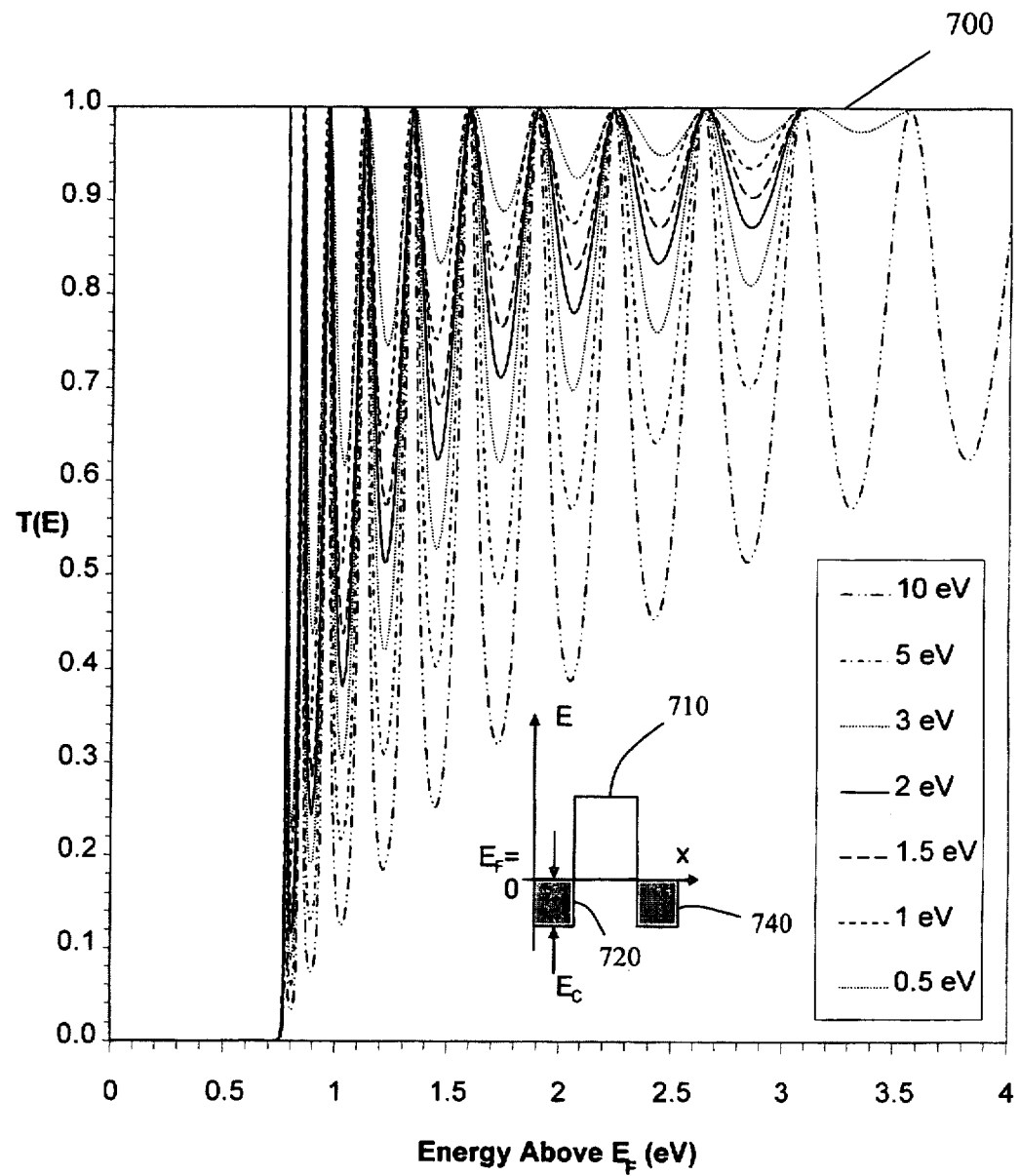
FIG. 7 is a composite graph shown here to illustrate the differences in tunneling probability as a function of electron energy for square collector barriers with various conduction band depths, ranging from 0.5 eV to 10 eV.

Turning now to FIG. 7, the effect of conduction band depth on hot electron transmission, T(E) is shown. FIG. 7 includes a composite graph 700 combining the calculated hot electron transmission curves for a variety of conduction band depth values. The inset graph illustrates the model used for the calculations, namely a square barrier 710 flanked by a first electrode 720 and a second electrode 740. The barrier in the present calculation is assumed to have a thickness of 4 nm and energy band height of 0.77 eV. The Fermi energy of the electrodes is assumed to be at E=0 eV. The numbers given in the legend correspond to the conduction band depth ($E_C$, in units of eV) below the Fermi level in the electrodes. As may be seen in FIG. 7, reduction of the conduction band depth to 1~2 eV results in reduced electron reflections, which is observed in the figure as oscillation depth, to acceptable values.

An added benefit to the use of metal-silicides, in the electrodes is their compatibility with standard integrated circuit processes. The tradeoff in using semi-metallic base and collector materials, rather than conventional metals, is increased base electrode resistance. The increase in base electrode resistance reduces the transistor's maximum oscillation frequency $f_{max}$, which is given by:

$$f_{max} = \sqrt{\frac{f_T}{8\pi R_B C_C}}, \quad (2)$$

Where $f_T$ is the transistor cutoff frequency (determined by the emitter differential resistance at bias and the emitter junction capacitance), $R_B$ is the small signal base resistance, and $C_C$ is the collector junction capacitance. When using semi-metallic base electrodes, the base resistance may be reduced by using a thicker layer of semi-metal as the base electrode and/or by adding a thin layer of a high-conductivity metal, such as tungsten. However, both approaches would somewhat reduce transistor gain since they tend to increase hot electron scattering in the base electrode and since the interface between the conventional metal and the semi-metal layer would additionally reflect hot electrons.

In this regard, the operation of transistor may be limited to operation at one of the oscillation peaks, as shown in FIG. 7. Additionally, ferromagnetic insulators and/or metals may be used in conjunction with the emitter or collector regions in order to enhance hot electron collection and differential resistance $R_S$ and provide electromagnetic feedback. Differential resistance $R_S$ is the resistance seen by an input, for example, an oscillating voltage V cos(wt), about a bias point.

The multi-layer metal approach may be further refined to produce a quarterwave anti-reflection layer between the conventional metal layer in the base electrode and the collector barrier. Still further, if the semi-metallic layer thickness and the conduction band depth are selected such that, at a specific energy, interference effects in the three layers tend to null out hot electron reflections. The transistor gain may be thereby increased accordingly.

The second approach to reduce quantum mechanical reflections is based on the use of a graded collector barrier energy band. The "shaped" barrier may be attained, for instance, by compositional changes in the barrier, rather than physical shaping of the conduction band edge in the oxide. A graded barrier energy band may be achieved, for example, by gradually grading a collector oxide from a low barrier material to a high barrier material (e.g., $Nb_2O_5$—$Nb_{2x}Ta_{2-2x}O_5$—$Ta_2O_5$) and back again to a low barrier material. This approach has been applied successfully in III–V semiconductor transistor structures,[4] but Applicants are unaware of application of this technique to non-semiconductor transistor technologies.

Figure 8:
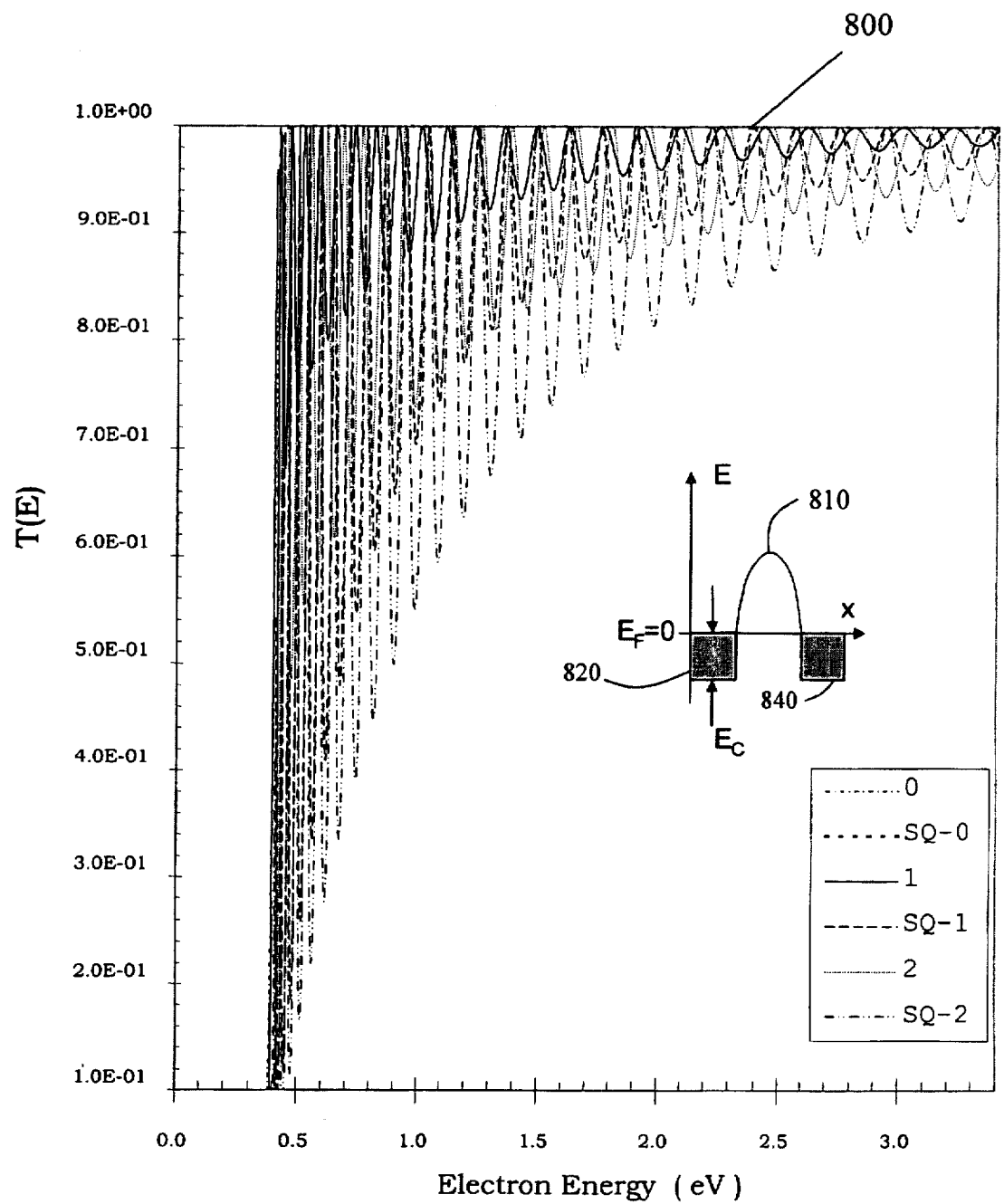
FIG. 8 is a composite graph shown here to illustrate the differences in tunneling probability as a function of electron energy for parabolic and square ("SQ") collector barriers with various conduction band depths, ranging from 0 eV to 2 eV.

Turning now to FIG. 8 in conjunction with FIG. 7, the effect of the grading of collector barriers in different ways is compared. As shown in the inset in FIG. 7, composite graph 700 indicates calculated hot electron transmission curves for a square barrier for a variety of conduction band depth values. FIG. 8 shows a composite graph 800 combining the calculated hot electron transmission curves for a parabolic barrier with a variety of conduction band depth values. The inset graph illustrates the model used for the calculations, namely a parabolic barrier 810 flanked by a first electrode 820 and a second electrode 840. In FIG. 8, the transmission of a square barrier energy band is compared with that of a parabolic barrier energy band, as indicated in the legend. FIG. 8 shows that the parabolic grading of the collector barrier significantly reduces hot electron reflections over that in the case of square collector barriers.

Figure 9:
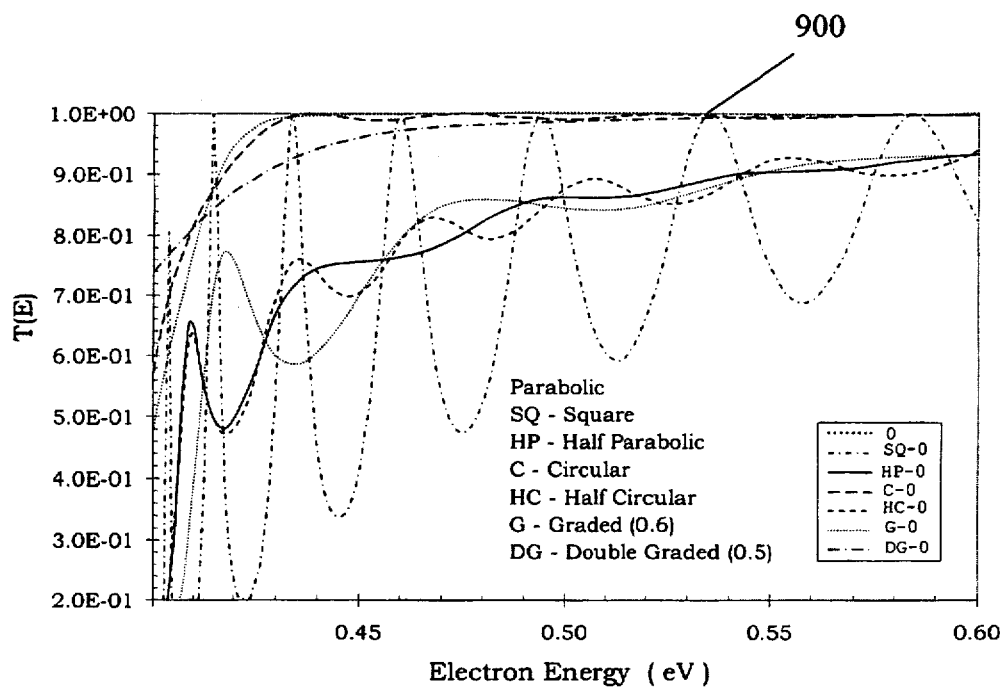
FIG. 9 is a composite graph shown here to illustrate the differences in tunneling probability as a function of electron energy for different collector barrier shapes. A 0 eV conduction band offset is assumed, with a barrier height of 0.4 eV.

Referring now to FIG. 9, the effects of differently graded collector barriers are compared. In FIG. 9, as indicated in the legend, the electron transmission through a configuration including square, parabolic, half-parabolic, circular, half-circular, linearly graded and half-linearly graded barrier energy bands are compared. An example of the square barrier configuration is shown, for example, in the inset within FIG. 7, the parabolic barrier energy band is shown in the inset within FIG. 9, and the rounded configuration is shown in FIG. 4A. FIG. 9 includes a graph 900 showing tunneling probability as a function of electron energy for a variety of collector barrier shapes. A 0 eV conduction band offset and a 0.4 eV barrier height are assumed. For the "half" designations, only the leading edge (i.e., base electrode side) of the collector barrier was assumed to be shaped. As may be seen in FIG. 9, grading one side of the collector barrier energy band reduces oscillations, while grading of both sides of the collector barrier energy band yields the greatest reduction of quantum mechanical reflection. Ideally, the grading of the conduction band edge of the barrier energy band from the metal conduction band edge to the maximum barrier energy band height then back down to the minimum height provides the greatest reduction in hot electron reflection. In the fabrication of actual devices, the closest approach would be to grade the energy band of the barrier material from as low of an energy as possible.

As discussed in the section regarding the reduction of base-collector leakage current, the quantum mechanical reflection of hot electrons is naturally alleviated by the use of a lower barrier energy band. This effect is due to the quantum-mechanical image force, which may be enhanced, for example, by the use of low dielectric constant insulating materials. Use of insulating materials with similar electron affinities but different dielectric constants may also contribute to the tailoring of the conduction band slope, or electric field, through the thin-film transistor structure.

The quantum mechanical reflections of hot electrons may be further reduced by incorporating an insulating material with a near-unity electron-tunnel mass. By using such a material, the base-collector dark current is reduced while decreasing the oscillation depth in the tunnel probability and, simultaneously, increasing the oscillation frequency, thereby resulting in a higher average tunneling probability over a range of energy.

More broadly, Applicants have recognized that a general consideration in the fabrication of an efficient, high speed thin-film transistor device is the consideration of wave function matching across the thin film layers as the ballistic electron traverses the device. In other words, by selecting appropriate materials and fabrication techniques in the formation of the various thin-film layers, thereby manipulating the wave function through each of the thin-film layers, the electron reflection at each interface between the layers may be tailored as desired. For instance, a particular material may be selected for use within a thin-film transistor structure due to the fact that the material exhibits a desired dielectric constant characteristic or chemical composition for that layer. The wave function of a given thin-film layer may be further influenced, for example, by grading the composition of the layer (e.g., to achieve a parabolic energy band profile), by application or generation of a magnetic field (e.g., in the case of ferromagnetic materials) or by adding a surface texture to that layer. Similarly, by implementing a double-insulator structure within, for instance, the emitter barrier, a narrower distribution of emitted electrons (i.e., more monochromatic energy electrons) may be achieved within the transistor. It is submitted that this recognition of the possibility of tailoring of certain characteristics of a thin-film transistor, such as the electron energy distribution width and electron reflection at interfaces, can be manipulated by wave function matching considerations is a significant advancement over the known art of thin-film transistors. Also, Fermi-level pinning and distribution of trap states at the base electrode—collector barrier as well as at the collector barrier—collector electrode interface may be used to aid in minimizing conduction band discontinuity.

Tunneling Hot Hole Transistors

As a complement to the aforediscussed tunneling hot electron transistors of the present invention, a thin-film tunneling transistor based on hot hole transport is described in detail immediately hereinafter.

Figure 3:
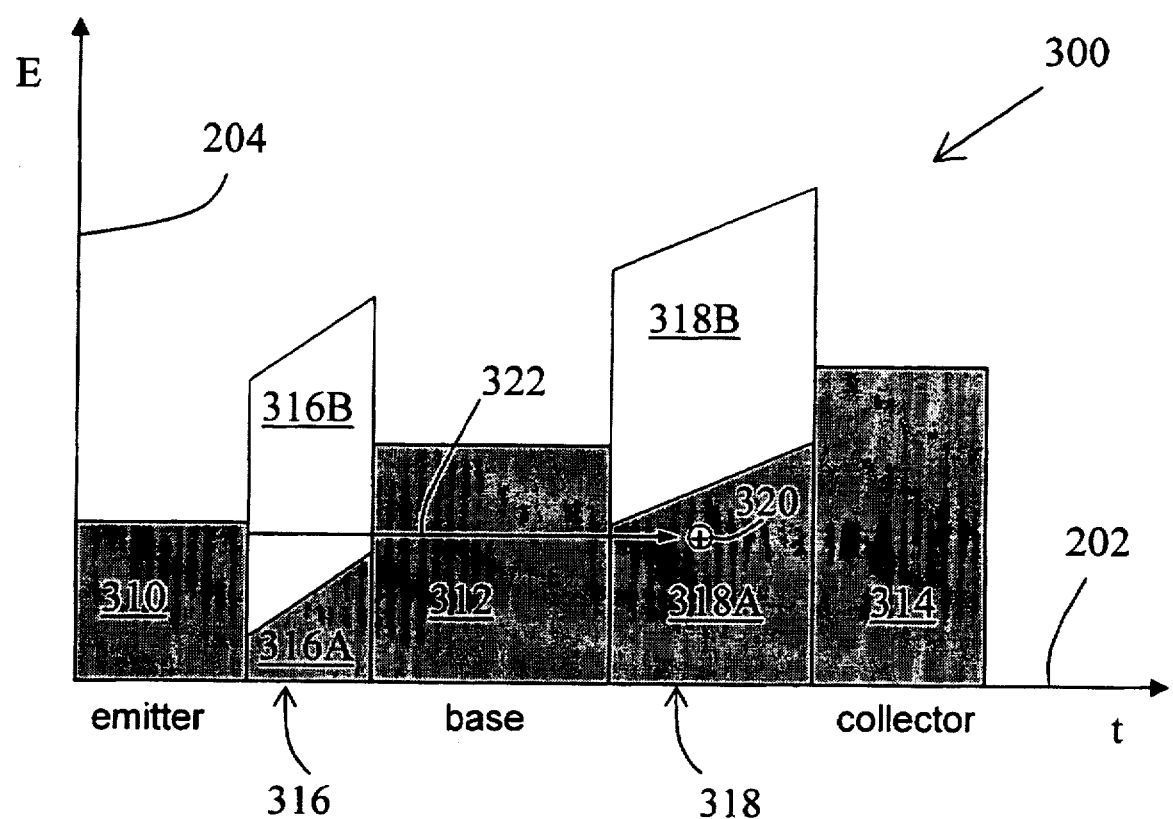
FIG. 3 is an energy band diagram corresponding to a hot hole transistor of the present invention.

The energy band diagram of a M-I-M-I-M hot hole transistor is shown in FIG. 3. Compared to the hot electron transistor, shown in FIG. 2, the energy bands are reversed; that is, barrier height for tunneling holes is the energy difference between the metal Fermi energy and the insulator valence band edge.

Continuing to refer to FIG. 3, an energy band diagram 300 corresponding to an N-I-N-I-N hot hole transistor structure is illustrated. The various portions of energy band diagram 300 corresponds to the variety of layers forming the N-I-N-I-N hot hole transistor, including an emitter electrode 310, a base electrode 312, a collector electrode 314, an emitter barrier structure 316 and a collector barrier structure 318. A hot hole 320 is emitted from the emitter electrode and surmounts the collector barrier to be subsequently collected in the collector electrode.

In order to achieve such a device, as illustrated in FIG. 3, the difference between the work function of the metal and the electron affinity of the insulator should be larger than the difference between the bandgap plus electron affinity of the insulator and the work function of the metal. Alternatively, external control methods may be used to suppress electron tunneling.[9]

Several improvements to the basic M-I-M-I-M hot hole transistor (as illustrated in FIG. 3) may be achieved in accordance with the techniques of the present invention. For instance, the incorporation of a double-insulator structure in the emitter barrier would yield the same advantages as those described above in reference to the hot electron transistor. Additionally, the double-insulator structure may be included in the collector barrier, which may help reduce base-collector leakage current and increase hot hole transmission.

Furthermore, the use of a graded collector barrier energy band would reduce hot hole reflection at the non-insulator—insulator interfaces. Also, as in the hot electron device, hot hole reflections may be minimized by the appropriate selection of base and collector electrode materials.

One major difference between the hot electron and hot hole devices is that, in the hot electron device, electrons tunnel from the conduction band of the metal into the conduction band of the insulator. In the hot hole case, holes tunnel from the conduction band of the metal into the valence band of the collector barrier.

Transistor Fabrication Process

Two methods of fabricating the thin-film transistors of the present invention are disclosed below:

1. The stack process,
2. The planar process.

The first method, referred to as the stack process, involves depositing the entire MIxMxIxM transistor stack in a single vacuum deposition system. As discussed earlier, the "M" layers referred to in the present narrative may be any appropriate non-insulating material including, for instance, metals or some combination of metals and non-metals. The layers may be deposited by various conventional methods such as, but not limited to, thermal evaporation, sputtering, chemical vapor deposition, and atomic layer epitaxy. A cluster tool may be used to perform varying depositions in separate chambers without exposing the structure to atmosphere. The stack process is believed to provide maximum control of layer thickness, composition, and cleanliness. The stack process may be subdivided into two domains: materials and processing. The materials challenge is to deposit the stack using possibly varying deposition methods to produce the desired electronic interfaces. The processing challenge is develop procedures that allow one to pattern and subsequently make contact to the desired layers which may be buried within central layers of the stack. It may be possible to break the transistor fabrication or stack, into multiple stacks, if one ensures the break regions are tolerant to intermediate processing.

The layers of the stack, in the most basic form, include an emitter metal, emitter-base oxide, base metal, base-collector oxide, collector metal. Since the top surface of the collector metal will be exposed to atmosphere following deposition, an oxidation resistant material, NbN for example, should be used to cap the collector metal unless milling, for example argon ion milling, is used in-situ to later remove any native oxide or contamination formed on top of the collector metal during subsequent processing. The base metal must be made thin with respect to the hot-electrons mean free path (~100 nm depending on electron energy and base metal). The base metal must also be "dug out" of the stack so it may be contacted to an external circuit. An etch stop may be incorporated to facilitate milling to the base layer. Furthermore, the base layer must not oxidize once exposed. This may be accomplished by incorporating a capping layer, for example NbN). The thin (~1–5 nm) emitter oxide may incorporate multiple adjacent oxides (or metals) to promote the emission of a mono-energetic electron beam. The thick (~4–20 nm) collector oxide may incorporate multiple adjacent oxides or silicides to reduce reflections of the emitted hot-electrons, while minimizing base-collector bias current. Although the emitter, base, and collector's are all described as metals, they may be semimetals, silicides, semiconductors, superconductors, or superlattices. Likewise, the emitter-base and collector-base oxides, need not be limited to conventional oxides.

Figure 10A:
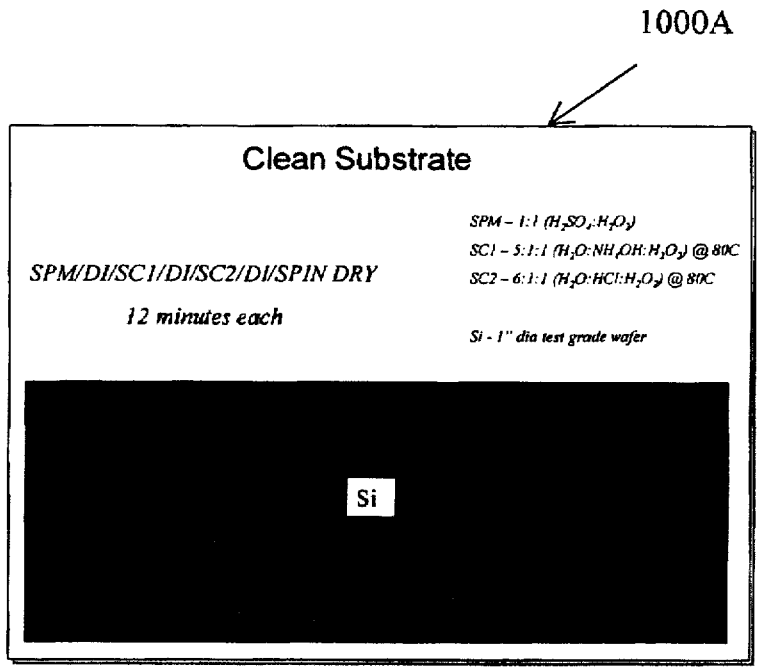
FIGS. 10A–10X are diagrammatic illustrations, in partial cross section, of the plurality of steps involved in a stack process for fabricating one embodiment of the hot electron transistor of the present invention.
Figure 10B:
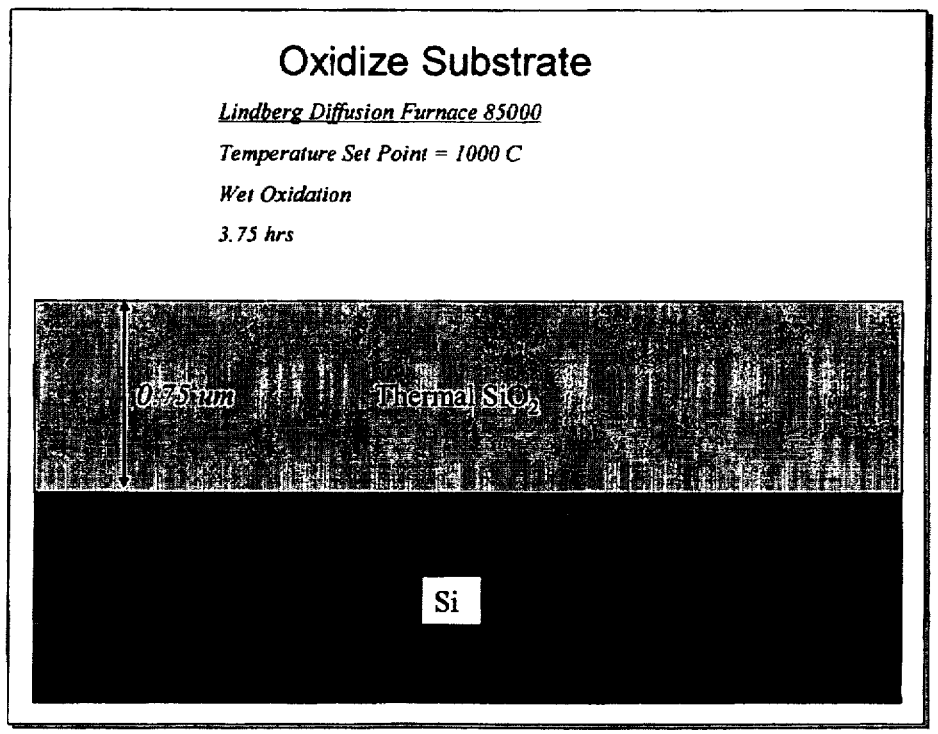
Figure 10C:
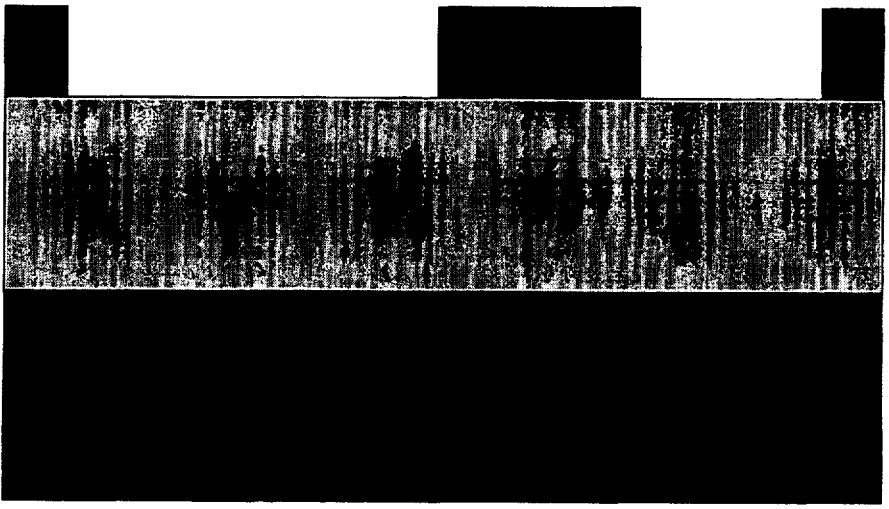
Figure 10D:
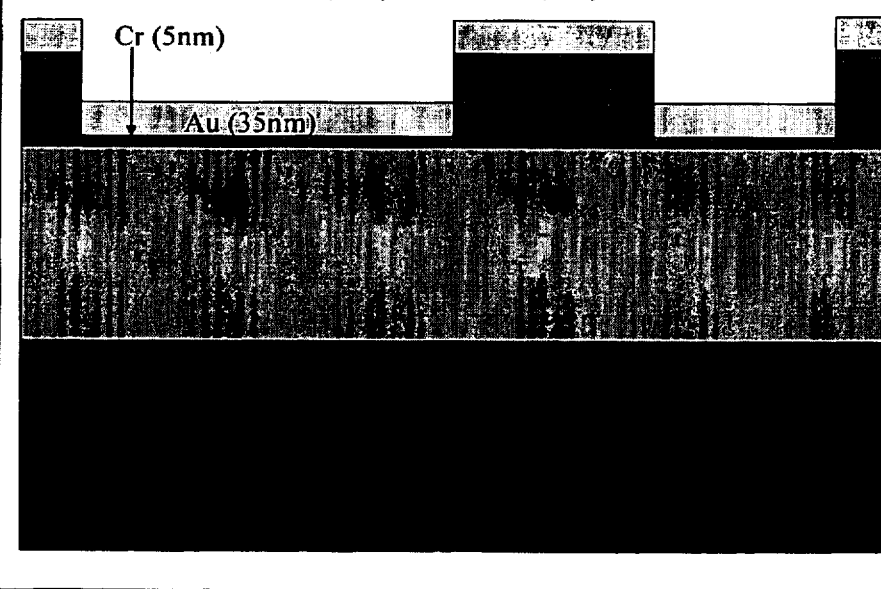
Figure 10E:
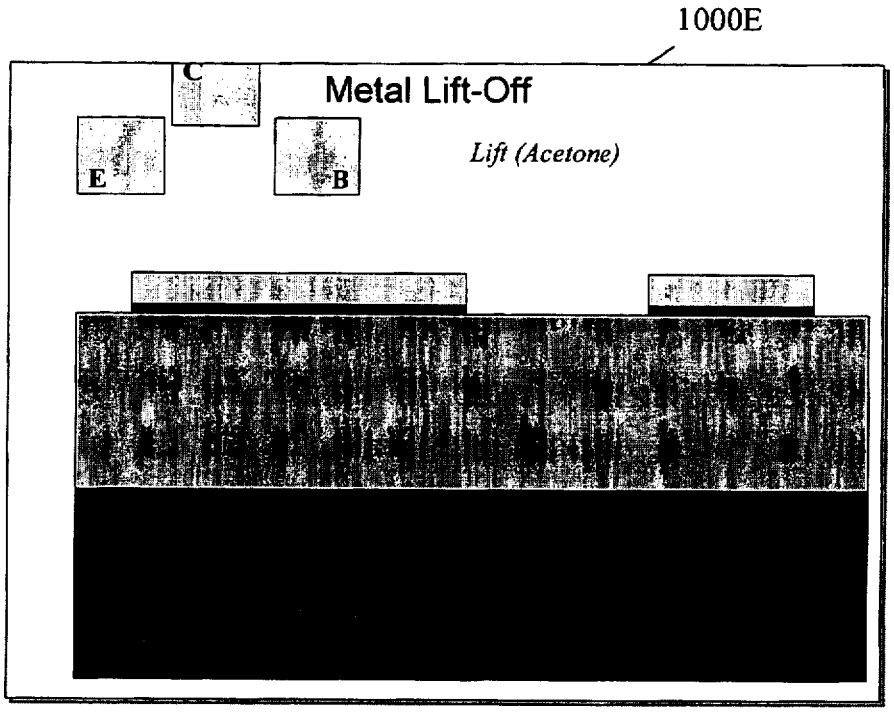
Figure 10F:
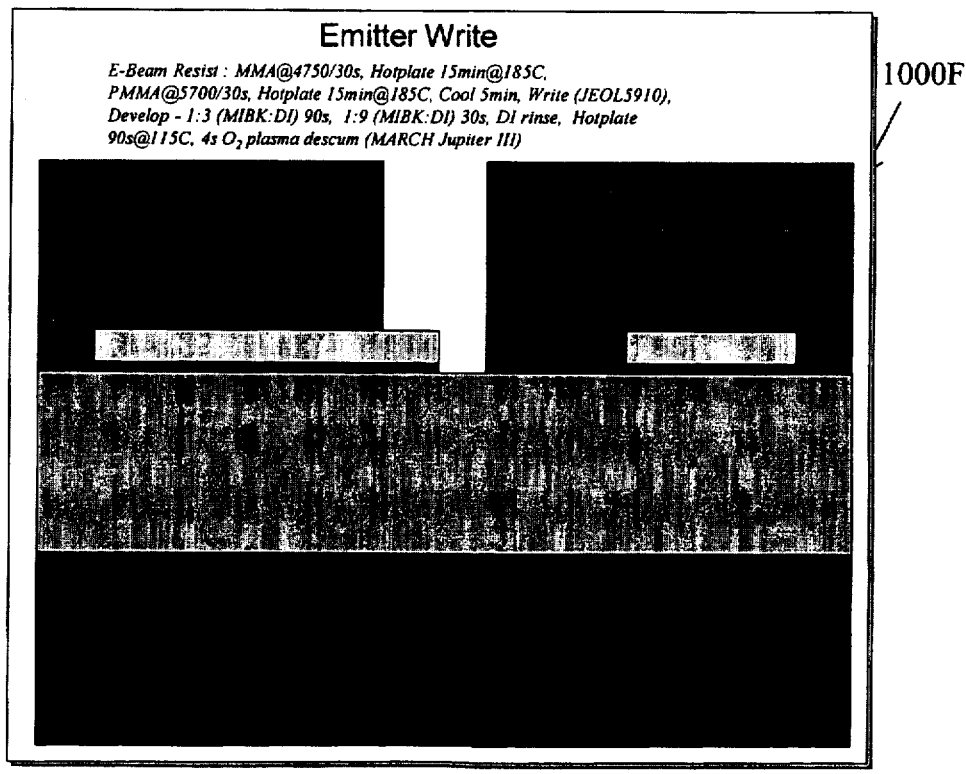
Figure 10G:
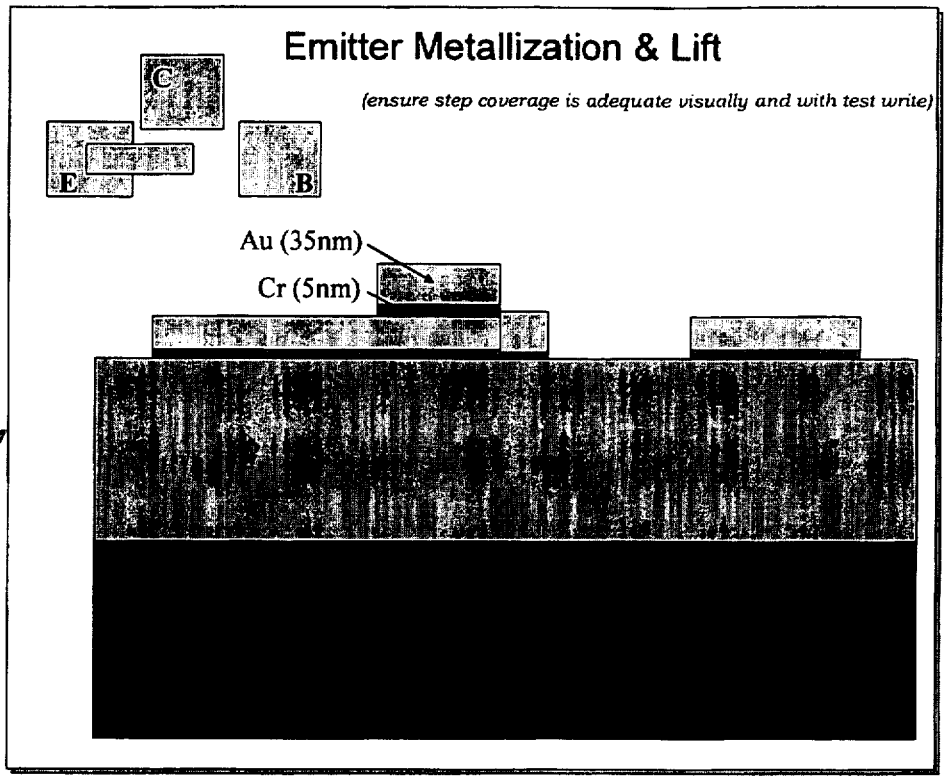
Figure 10H:
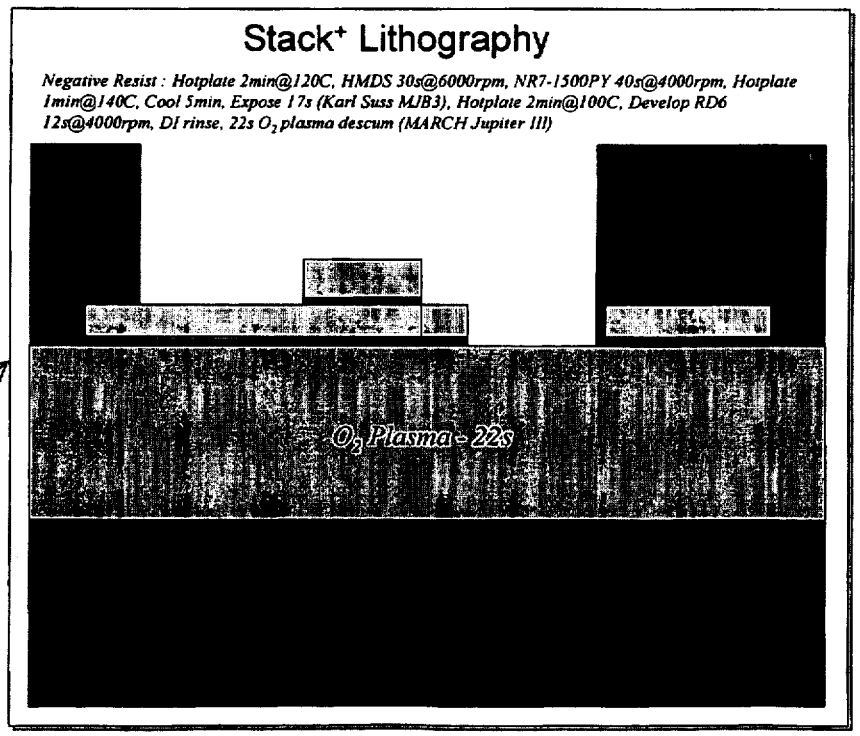
Figure 10I:
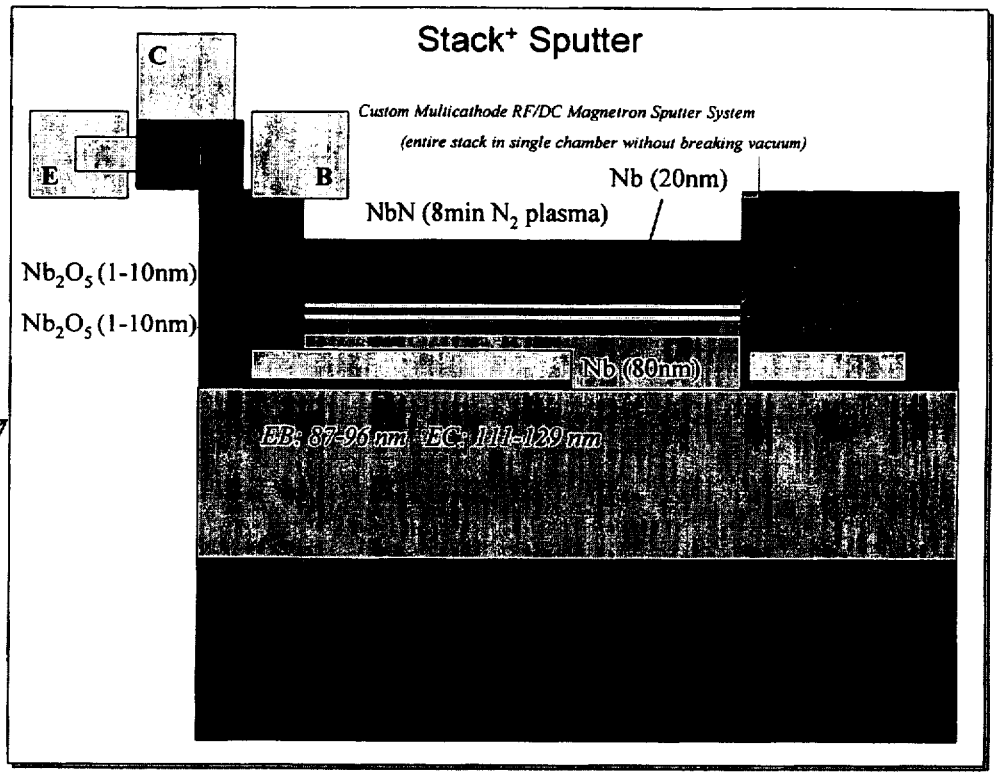
Figure 10J:
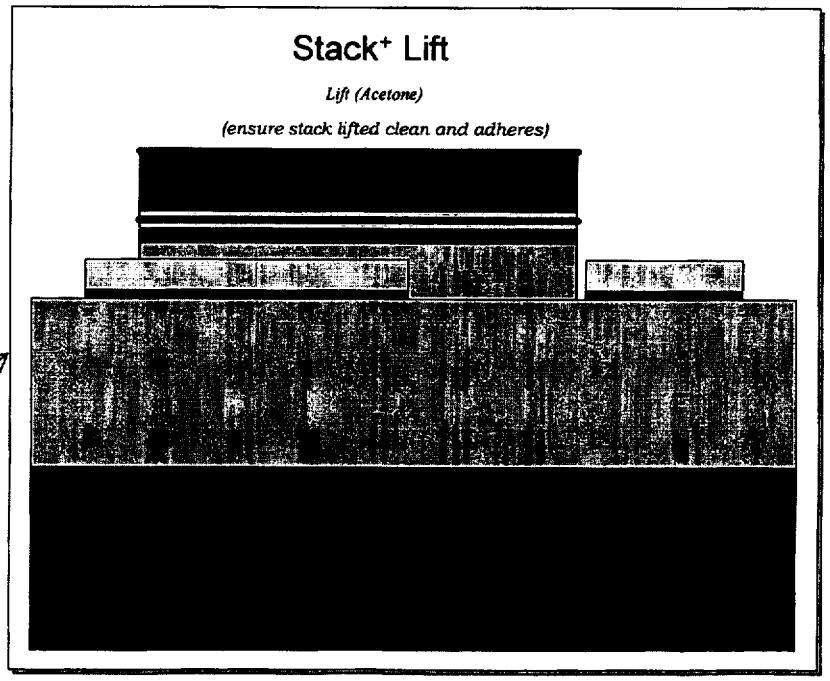
Figure 10K:
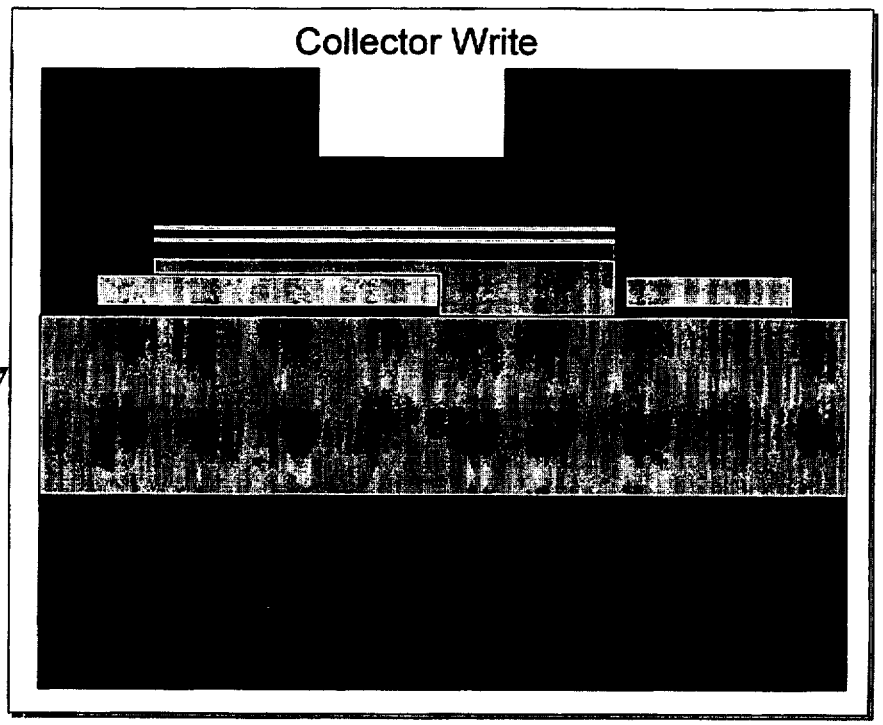
Figure 10L:
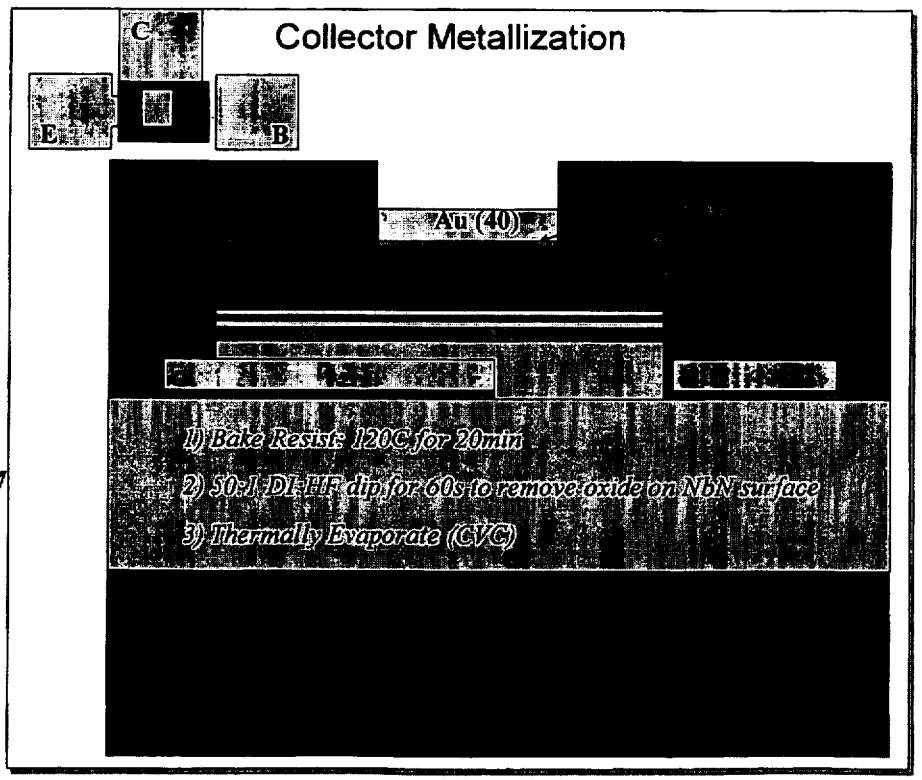
Figure 10M:
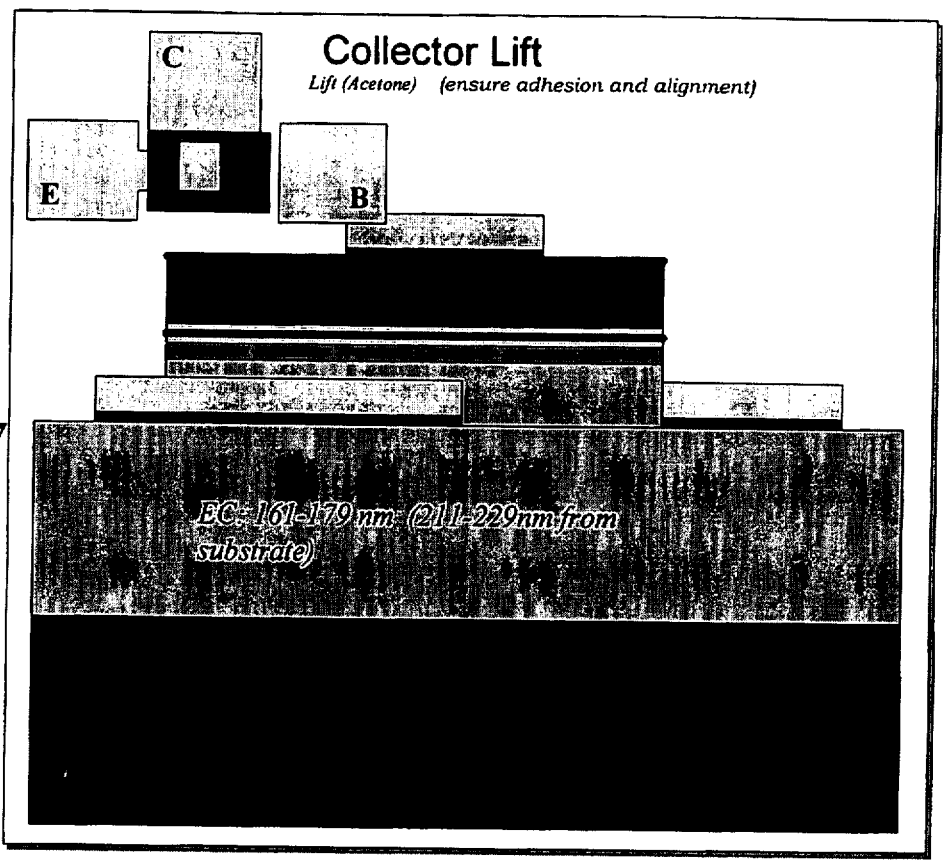
Figure 10N:
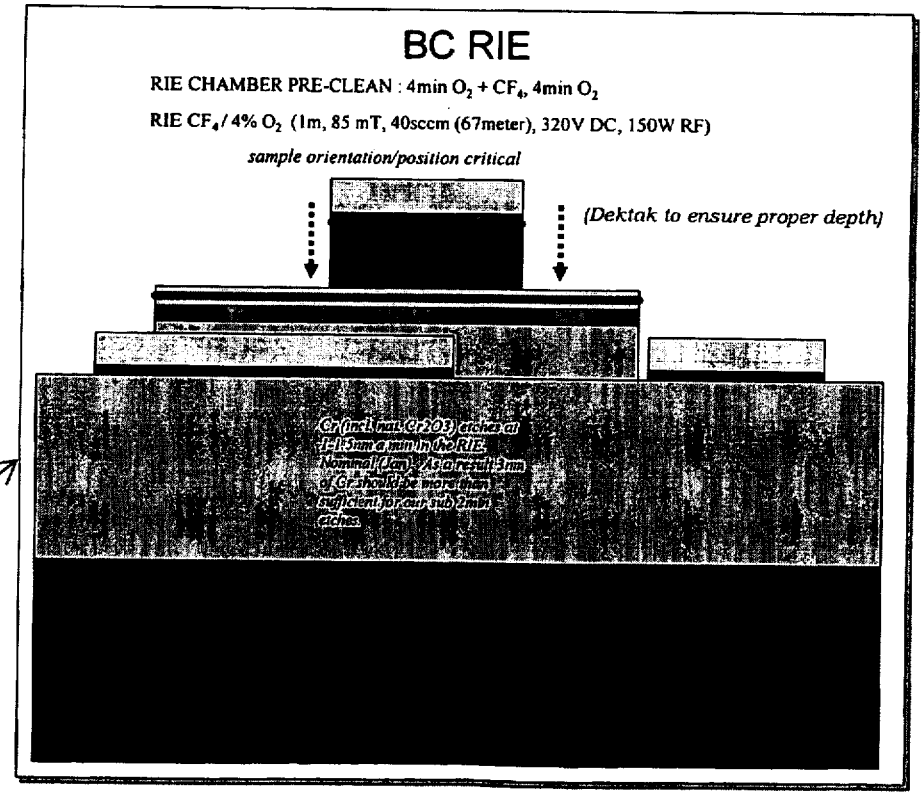
Figure 10O:
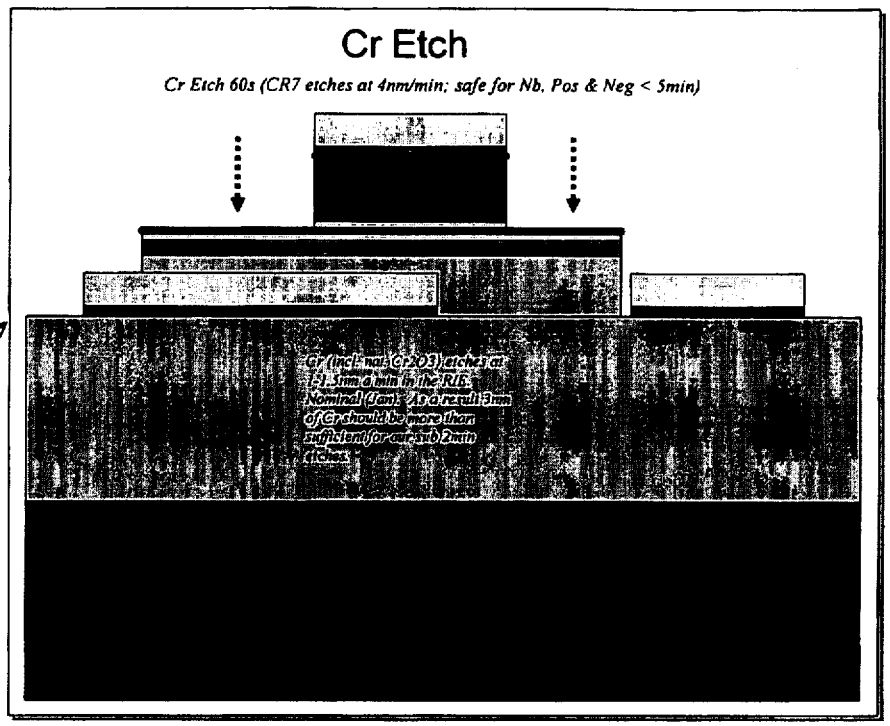
Figure 10P:
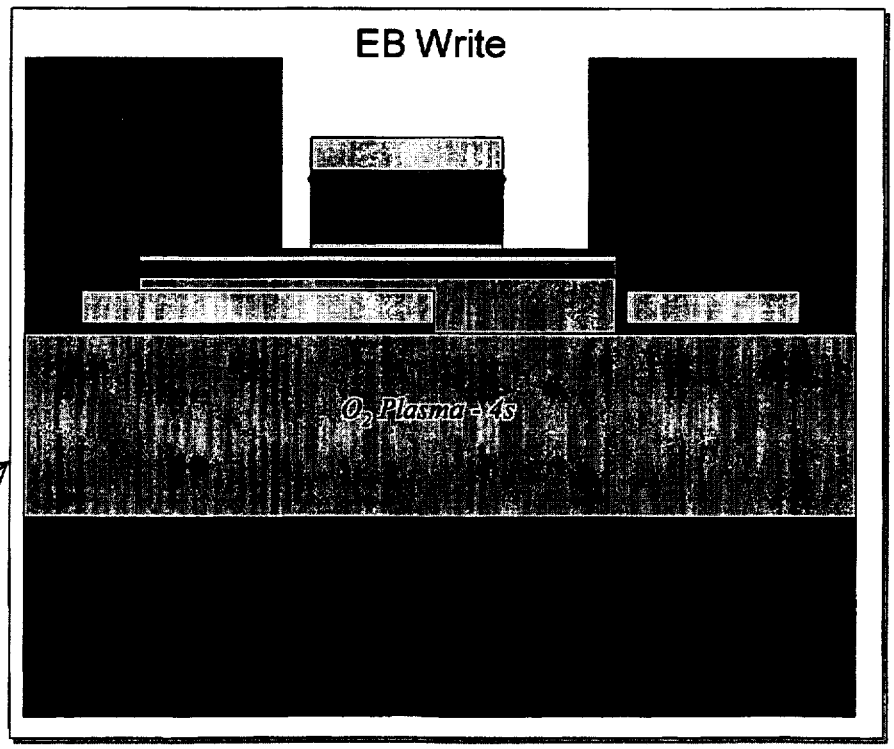
Figure 10Q:
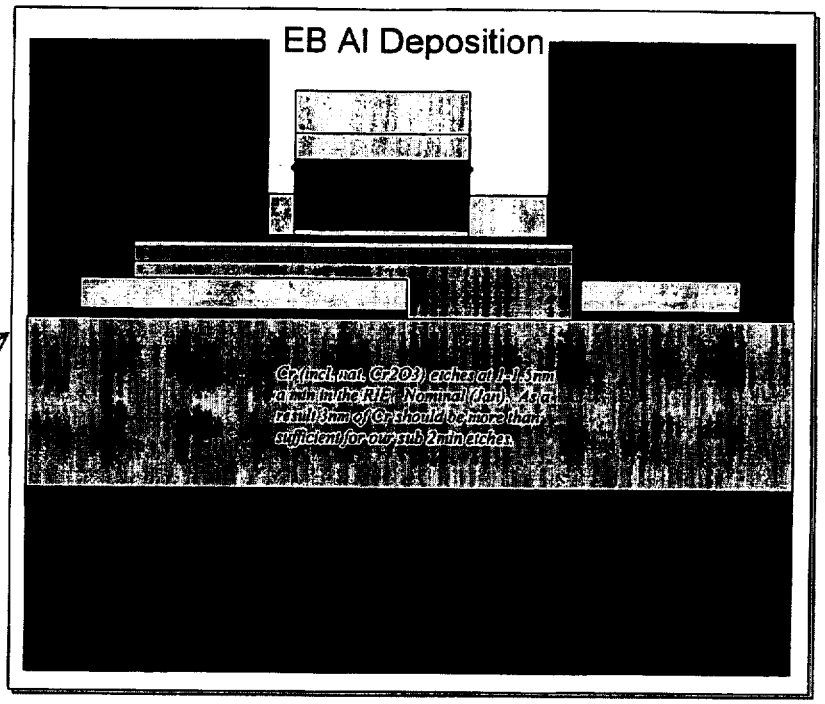
Figure 10R:
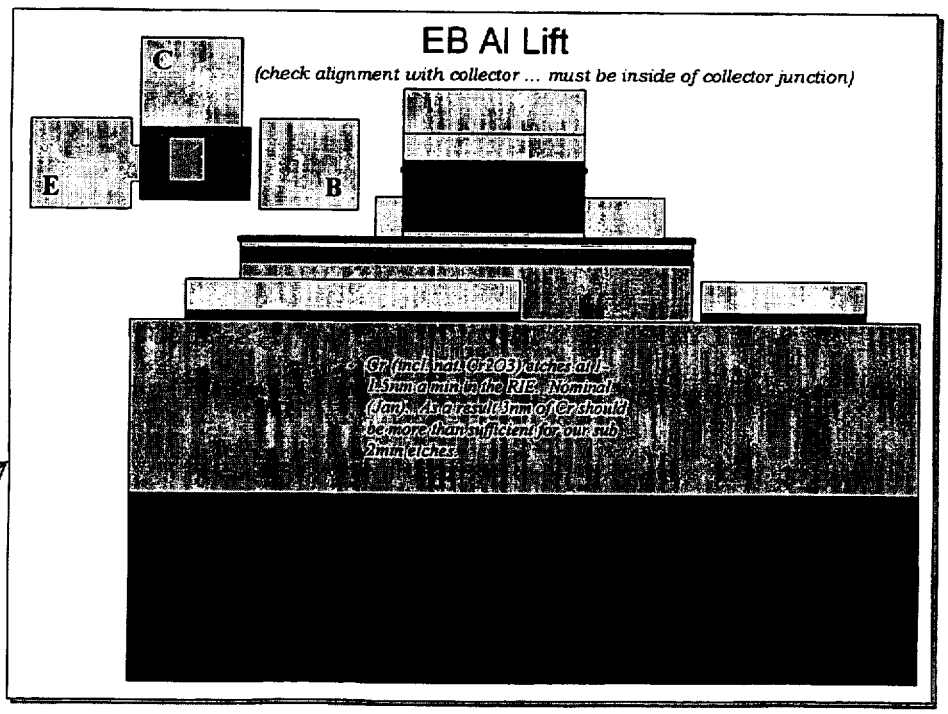
Figure 10S:
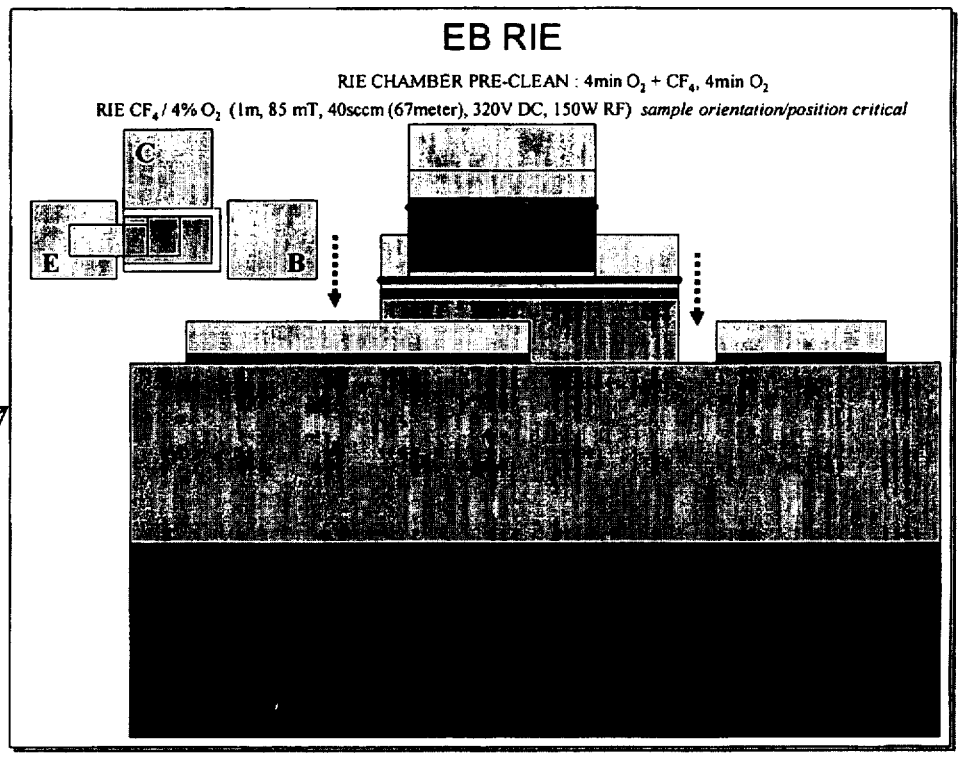
Figure 10T:
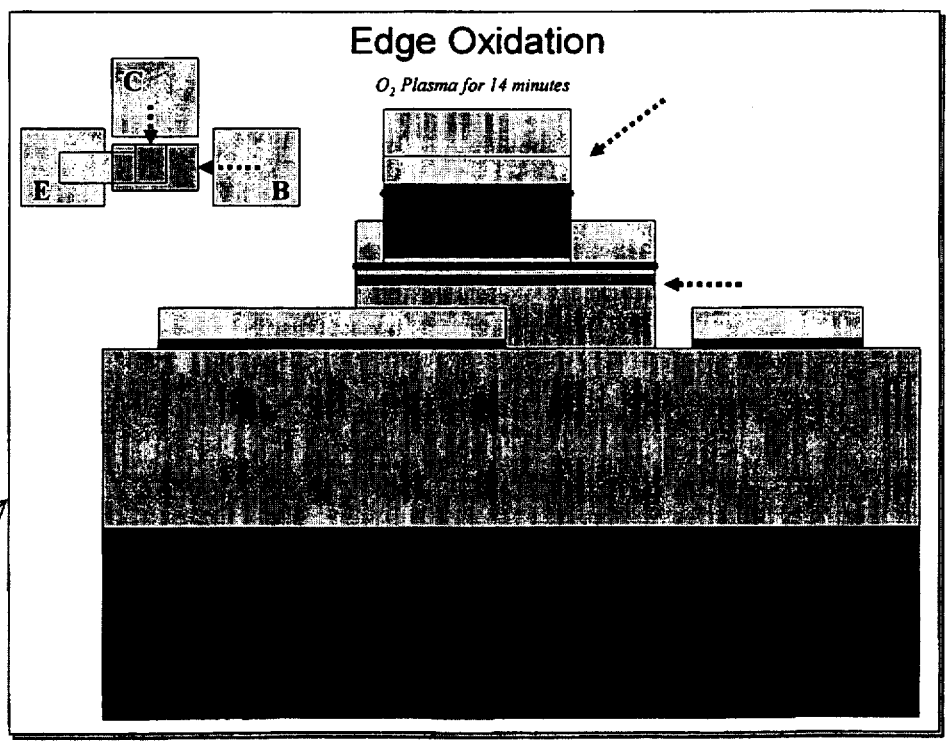
Figure 10U:
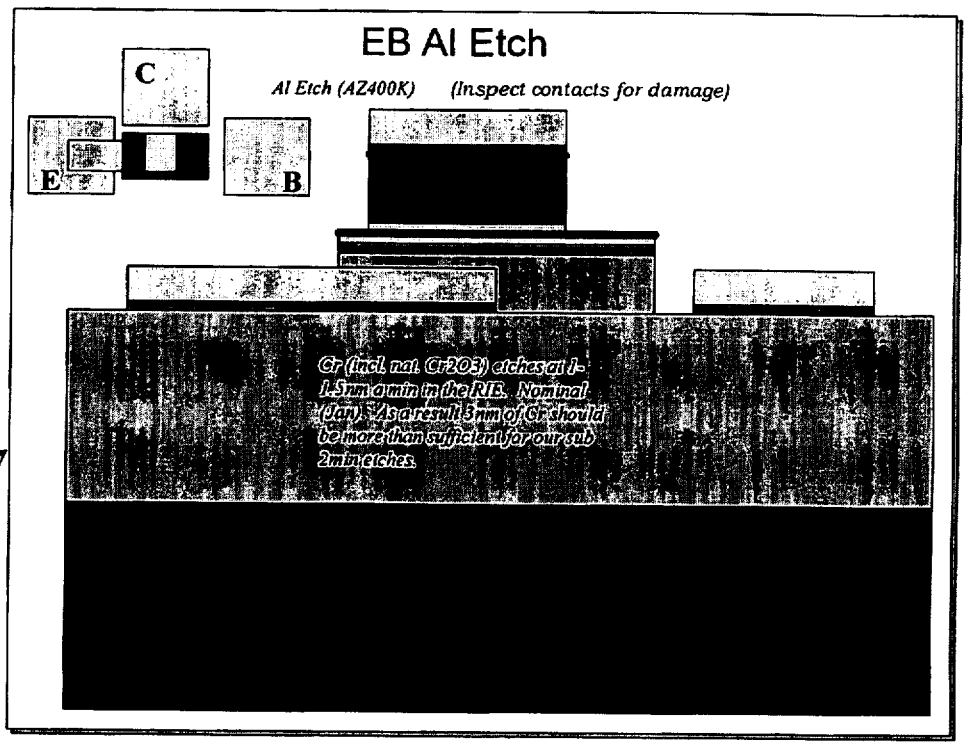
Figure 10V:
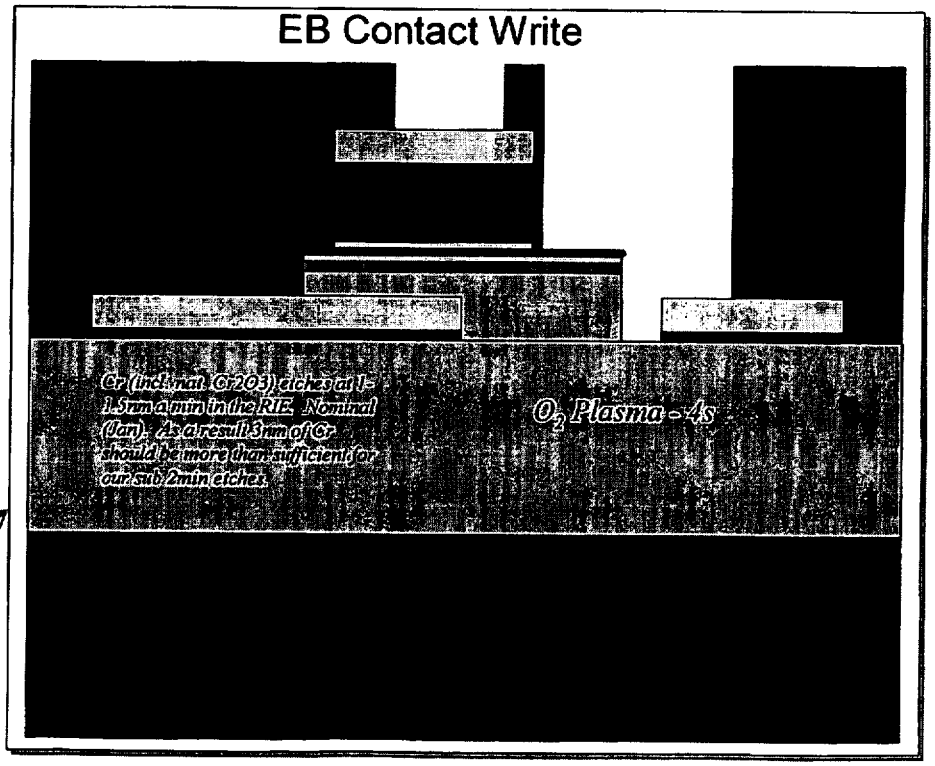
Figure 10W:
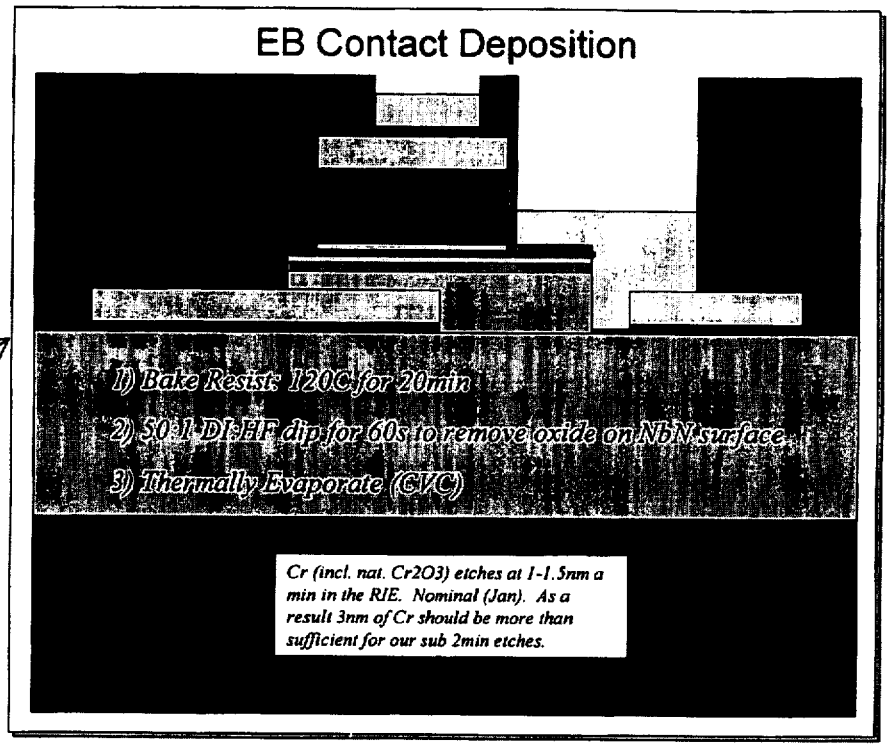
Figure 10X:
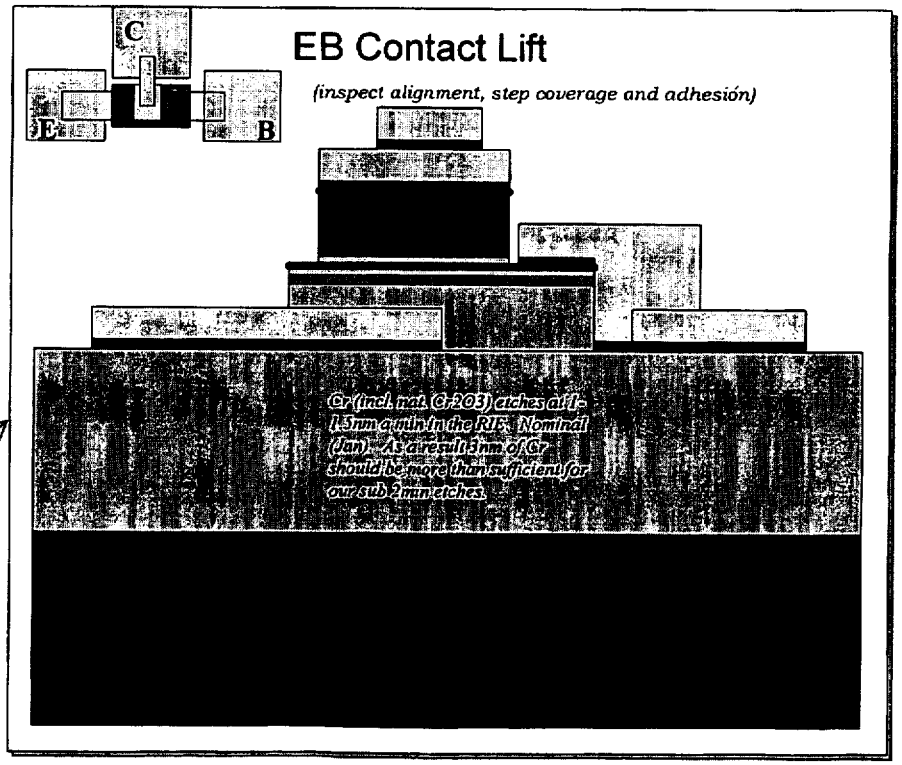
Figure 11A:
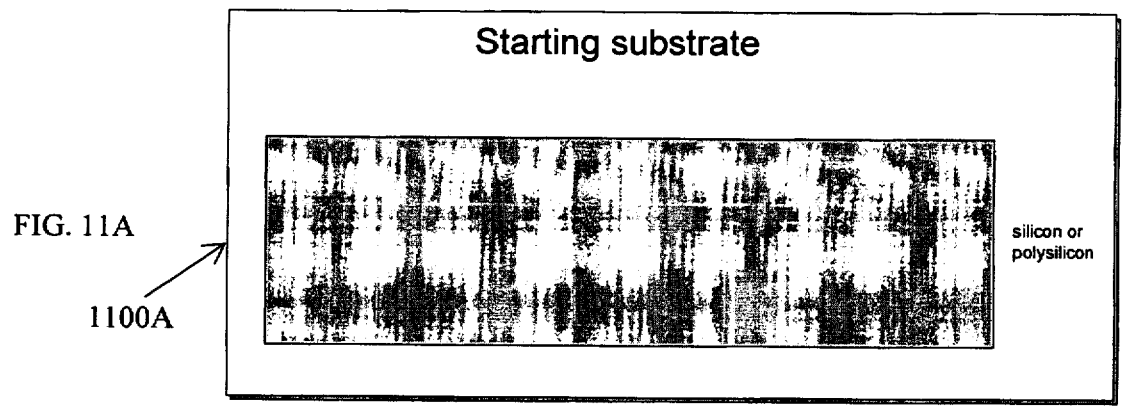
FIGS. 11A–11I are diagrammatic illustrations, in partial cross section, of the plurality of steps involved in a planar process for fabricating another embodiment of the hot electron transistor of the present invention.
Figure 11B:
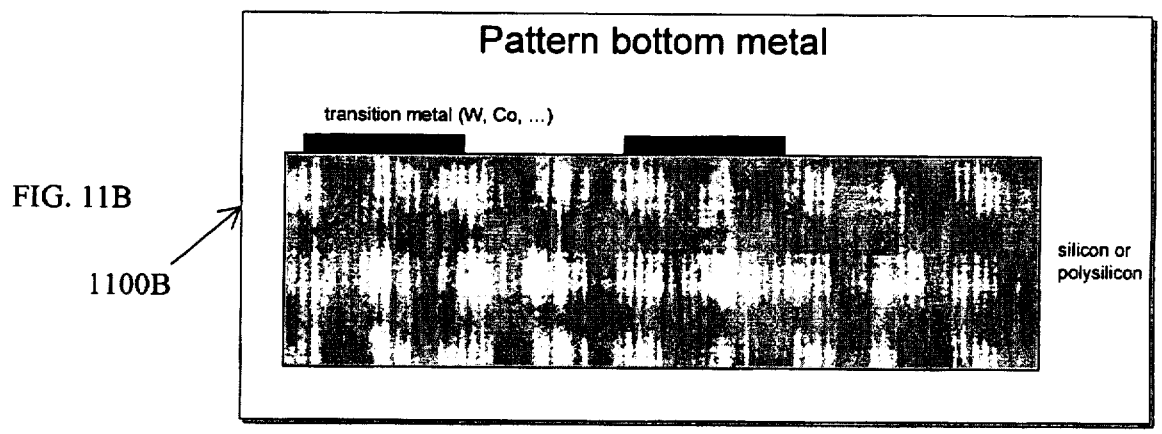
Figure 11C:
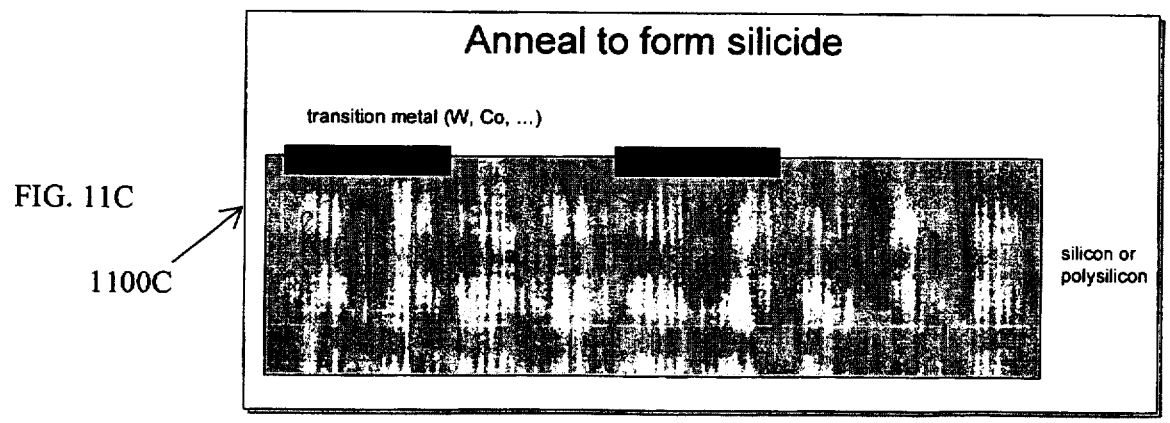
Figure 11D:
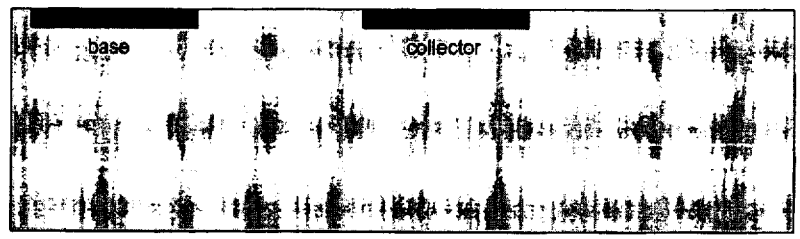
Figure 11E:
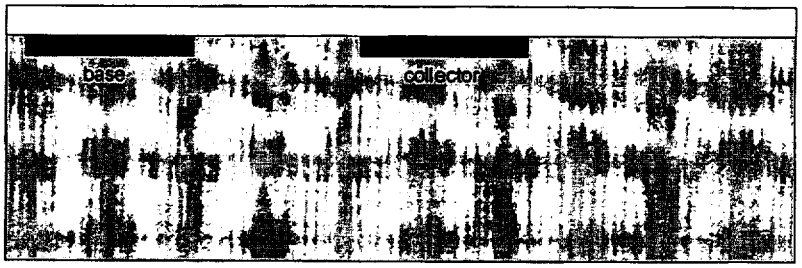
Figure 11F:
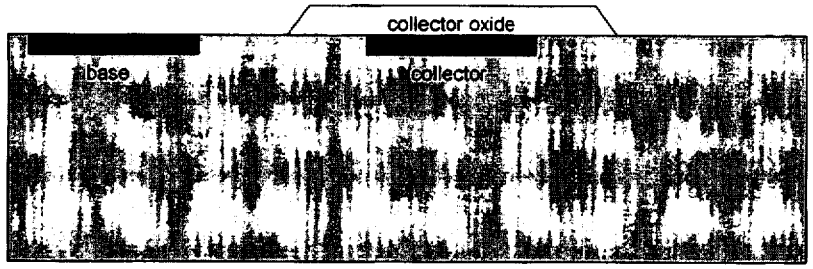
Figure 11G:
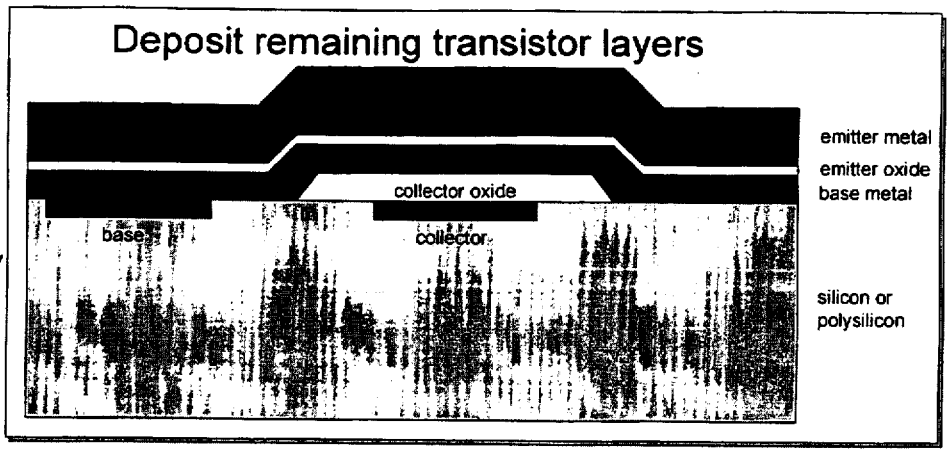
Figure 11H:
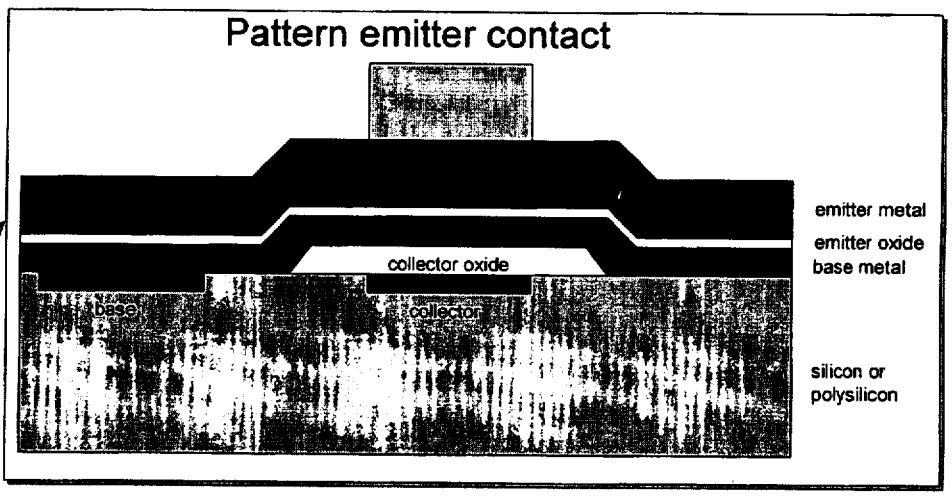
Figure 11I:
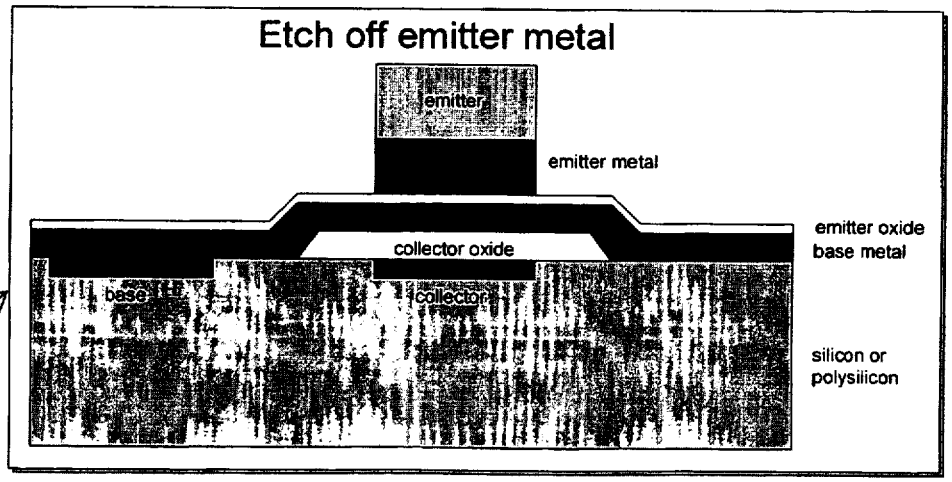

The fabrication process described below utilizes a single stack deposition, reactive ion etching RIE, and the lift-off technique to form the patterned metal layers. Formation of the patterned metal layer is also possible by chemical etching, reactive ion etching, milling and other techniques. A variety of substrates may be used on which to fabricate the MIxMxIxM transistor; a silicon substrate is used in the process described below. A summary of the fabrication process for a typical device is shown in FIGS. 10A–10X and described below:

1. Thoroughly clean a silicon wafer, for example using a standard SPM, SC1, BOE, SC2 sequence.
2. Thermally oxidize the substrate, less than 1 μm thick, to provide electrical isolation between the MIxMxIxM transistor and silicon substrate.
3. Form an emitter contact pad (for electrically accessing the device):
   a. Lithography to define the contact pad shape:
      i. Spin on a primer (HMDS) at 6000 rpm for 30 seconds,
      ii. Spin on a resist at 6000 rpm for 30 seconds (time and spin speed are dependent on the specific resist used),
      iii. Pre-bake the resist layer on a hotplate at 110° C. for 60 seconds (time and temperature are dependent on the specific resist used),
      iv. Expose the resist layer for 18 seconds (exposure time is dependent on the specific resist used and the resist thickness),
      v. Develop the resist layer using a developer solution (4:1 ratio of DI water to developer) for a predetermined time, (developer solution depends upon specific resist and developer used)
      vi. Rinse off the developer with DI water,
      vii. $O_2$ plasma cleaning to clean the resist openings;
   b. Thermal evaporation of bond layer (5 nm of chromium) to serve as a scratch-resistant metal, through which the device can be electrically probed;
   c. Thermal evaporation of contact layer (35 nm of gold) for preventing oxidation of the contacts and promoting an ohmic contact to the emitter layer of the stack;
   d. Lift-off to remove extraneous material:
      i. Lift-off with acetone on spinner at low speed,
      ii. Ultrasonic bath with acetone (if necessary to promote lift-off),
      iii. Lift-off with acetone on spinner,
      iv. Clean with isopropyl alcohol on spinner,
      v. Spin dry;
   Depending on the desired transistor size and lithography capabilities, this step may be broken into multiple steps. For example, large traces may be patterned with standard optical lithography and connections from the transistor to these traces may be formed with electron beam lithography.
4. Deposit the MIxMxIxM transistor stack. The transistor stack may be either deposited over the entire wafer, or, in specific regions of the wafer defined by a lift-off step. The following stack: provides an example of a stack which is deposited in a single vacuum deposition tool.
   a. Nb emitter metal (80 nm)—chosen for its barrier properties with the emitter-base oxide, ability to rie mill in $CF_4/O_2$, ability to form an edge oxide, good adhesion to the emitter contact. The metal is deposited by, for example, direct sputtering.
   b. $Nb_2O_5/Ta_2O_5$ emitter-base oxide (2 nm/2 nm)—the II structure provides a narrow width of emitted electrons, ability to RIE etch in $CF_4/O_2$, and ease of reactive sputtering.
   c. Nb/NbN/Cr/Nb base metal (3 nm/1 nm/3 nm/3 nm)—the base metal incorporates Nb on the outer edges chosen for its barrier properties with the emitter-base and base-collector oxides, ability to RIE mill in $CF_4/O_2$, and ability to form an edge oxide. Interdisposed within the base metal is a Cr layer which functions as an RIE etch stop, allowing one to precisely stop at the base metal, and easily oxidize the edges. The NbN provides an oxidation resistant contact to the base electrode after the Cr is removed. The metal is deposited by, for example, direct sputtering. The nitride may be formed by a nitrogen plasma, reactively sputtered, or directly sputtered.
   d. $Nb_2O_5$ base-collector oxide (10 nm)—a low and wide collector oxide is used to allow for passage of the hot electrons arriving from the emitter while lowering the base-collector current that may result from a bias that may be applied or generated across the collector oxide. Grading the oxide composition, to obtain a non-abrupt metal-oxide interface is preferable for reducing reflection of hot-electrons impinging the barrier. The oxide is deposited, for example, by reactive sputtering.
   e. Nb/NbN collector metal (20 nm/1 nm)—the collector metal is chosen for its barrier properties with the collector oxide, ability to RIE mill in $CF_4/O_2$, and the compatibility with the stable nitride NbN. The metal is deposited by, for example, direct sputtering. The nitride may be formed by plasma, reactively sputtered, or directly sputtered.
5. Deposit collector definition metal—the collector definition metal is used to provide an RIE etch mask and as such defines the size of the collector-base side of the transistor. A lift-off process with Cr/Au (5 nm/35 nm) may be used. Au is resilient to the RIE etch and provides a good electrical contact to the transistor and external probes/pads. A 50:1 $H_2O$:HF dip may be used to remove any possible oxidation that may have occurred on top of the NbN in previous processing steps.
6. RIE mill collector-base—using a $CF_4/O_2$ RIE system the transistor stack is etched down to the Cr etch stop layer within the base metal.
7. Remove etch stop—using dry etching or wet chemical etching the Cr metal etch stop within the base, not protected by the collector-base structure is removed thus exposing the NbN layer of the base.
8. Deposit emitter definition metal—using lift-off techniques aluminum is deposited over the stack (including a portion of the collector) to define the emitter-base size. The Al functions as an etch mask.
9. RIE etch emitter-base portion of the stack.
10. Edge Oxidation—The edges of the emitter and base metal may now be oxidized to protect and passivate. This may be accomplished by oxide deposition or use of a oxygen plasma.
11. Remove Al etch mask—the Al etch mask is easily removed using AZ400K.
12. Using a lift-off process a base contact metal is deposited. Cr/Au (5 nm/180 nm) is deposited on top of the exposed base NbN. A 50:1 $H_2O$:HF dip may be used to remove any possible oxidation that may have occurred on top of the NbN in previous processing steps. This process may also include a collector metal contact to extend the collector contact to external circuit or probe pads.

The resulting structure places the emitter at the bottom of the stack and the collector at the top of the stack. This is not a necessity and the emitter and collector locations could be reversed. Depending on the depositions techniques used a particular order may be advantageous.

The second fabrication method, referred to as the planar process, involves patterning base contacts and collector or emitter contacts onto the substrate before subsequent fabrication of the remainder of the transistor structure. The advantage of this method is that it eliminates the need to etch down to the thin base metal—a tenuous process. The disadvantage of this method is that it breaks the deposition of the MIMIM stack into two stages so that one interface in the transistor structure is exposed to ambient atmosphere, which may lead to contamination of this interface and possibly native oxidation of the exposed surface. A summary of the fabrication process for a typical device is shown in FIGS. 11A–11I and described below:

1. Clean silicon (or polysilicon) substrate surface
2. Pattern base and collector (or emitter) electrode metals on silicon surface
3. Anneal the wafer to diffuse the electrode metals into the silicon and to form metal-silicides
4. Etch wafer to remove remaining metal, leaving conductive silicide traces on the silicon surface
5. Deposit and pattern collector oxide onto the surface above the collector electrode
6. Pattern base and collector contacts (typically gold) off to the side of the transistor structure
7. Deposit the base metal/emitter oxide/emitter metal stack onto the surface
8. Pattern etch mask over transistor junction and underlying base electrode
9. Etch away remaining stack, leaving base-oxide-emitter stack over collector and across base electrode
10. Remove etch mask
11. Pattern the thick emitter contact layer (typically gold) centered above the collector contact
12. Using the emitter contact layer as a mask, etch the remaining emitter metal down to the emitter oxide Applications of Metal-Insulator Thin-Film Transistors We describe several applications of metal-insulator thin-film transistors. Aside from the normal applications as a linear amplifier, oscillator, or switch, we discuss several aspects of the hot electron/hot hole transistor that may make it useful in rather novel applications.

1. Linear Amplifier/Oscillator

Figure 12A:
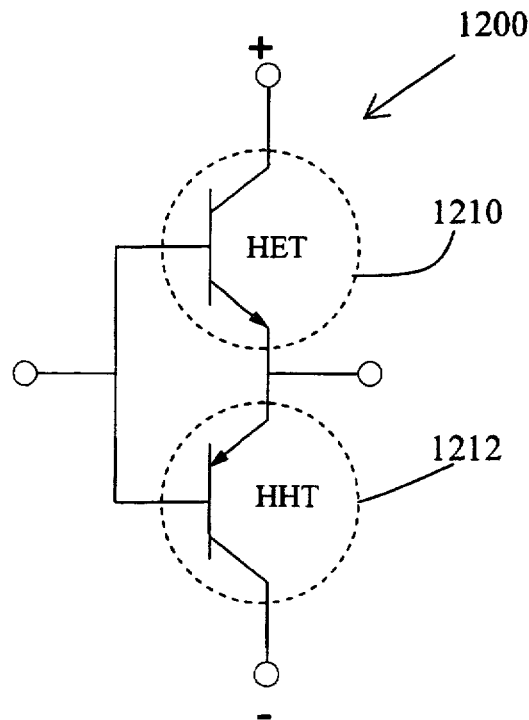
FIG. 12A is an equivalent circuit diagram of a linear amplifier based on the hot electron transistor and the hot hole transistor of the present invention.

The obvious application of these transistors is as a linear amplifier. FIG. 12A shows an equivalent circuit diagram of a linear amplifier 1200 including a hot electron transistor 1210 of the present invention and a hot hole transistor 1212 of the present invention in a push-pull configuration. As such, they may be useful as power amplifiers, low-noise amplifiers, or oscillators in high frequency circuits. Using both hot electron and hot hole devices, a push-pull amplifier configuration may be realized. Because these devices are thin film and very fast, they may find use in flexible electronics, microwave circuits on low loss or flexible substrates, and hybrid circuits where they may be integrated with silicon CMOS or III–V optoelectronics, for example.

2. SPDT Switch

Figure 12B:
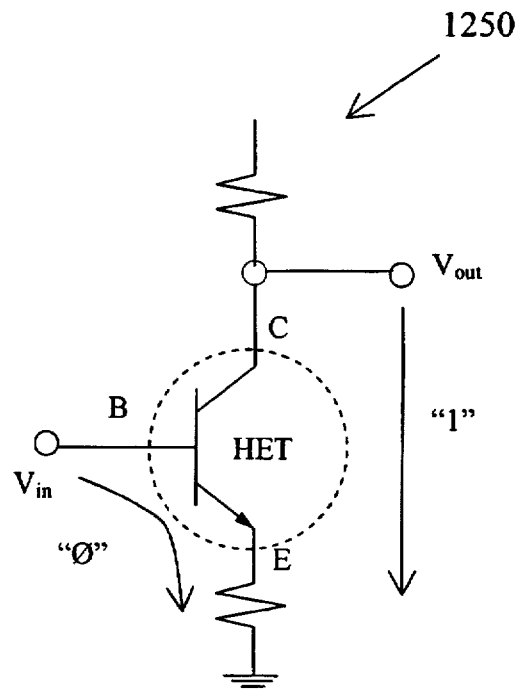
FIG. 12B is an equivalent circuit diagram of a switch based on the hot electron transistor of the present invention.
Figure 12C:
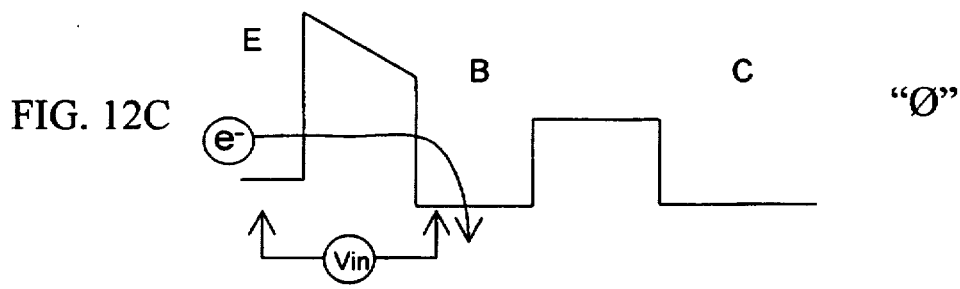
FIGS. 12C and 12D are energy band diagrams illustrating the operation of the two states of the switch shown in FIG. 12B.
Figure 12D:
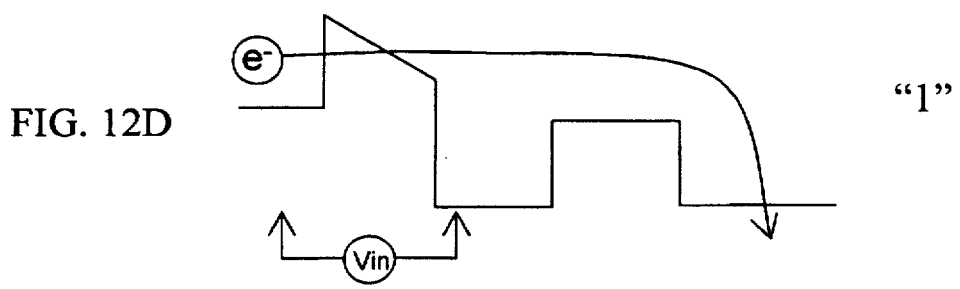

An interesting feature of hot electron (hole) transistors is that they have a non-zero turn-on voltage since emitted electrons must have enough energy to surmount the collector barrier. Since the majority of emitted electrons have an energy approximately equal to that of the base-emitter voltage, the turn-on threshold is approximately equal to this barrier height. Thus, for base-emitter voltages greater than the threshold, the majority of emitter current goes to the collector contact; for base-emitter voltages less than the threshold, however, the emitter current cannot surmount the collector barrier and goes out the base contact. In this way the hot electron transistor functions as a single-pole, double-throw (SPDT) switch. The equivalent circuit diagram of an example of such a device is shown in FIG. 12B, with the energy band diagrams for the different switch states shown in FIGS. 12C and 12D.

3. Negative Differential Resistance Amplifier/Oscillator

Figure 12E:
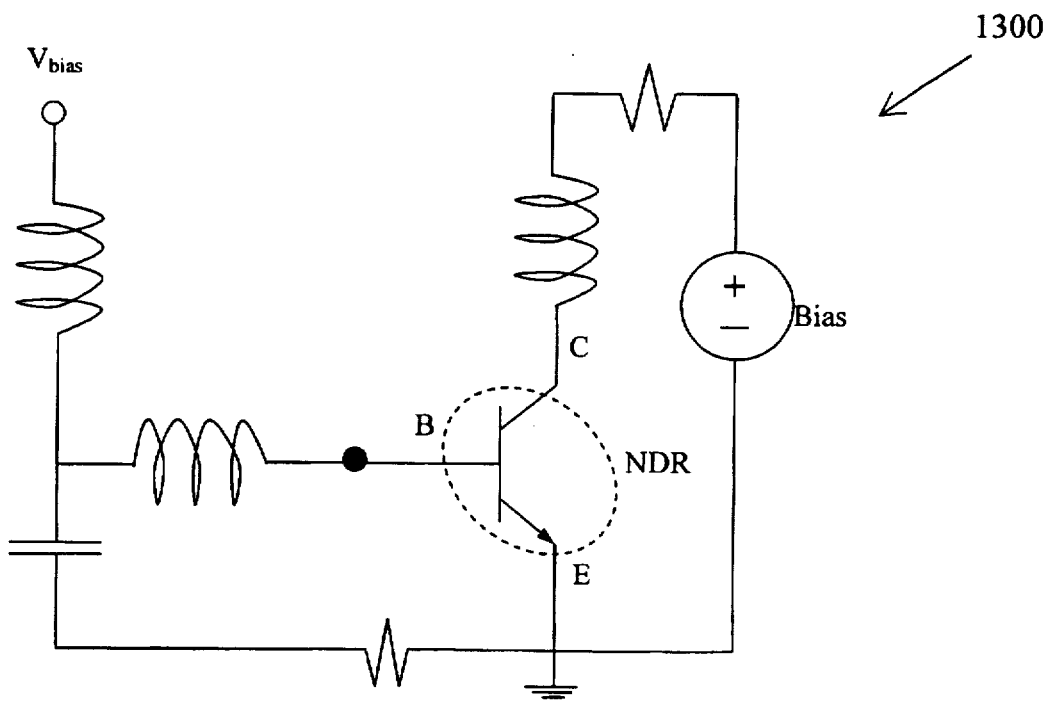
FIG. 12E is an equivalent circuit diagram of an oscillator by negative differential resistance (NDR) based on the hot electron transistor of the present invention.

As base-emitter voltage is increased, emitter current is switched from base to collector, as described above. The result is a negative differential resistance between the base and emitter as the current begins to switch. As is well known, negative differential resistance may be used for amplification and oscillation. The equivalent circuit diagram of such a device is shown in FIG. 12E.

4. Multivibrator

Figure 12F:
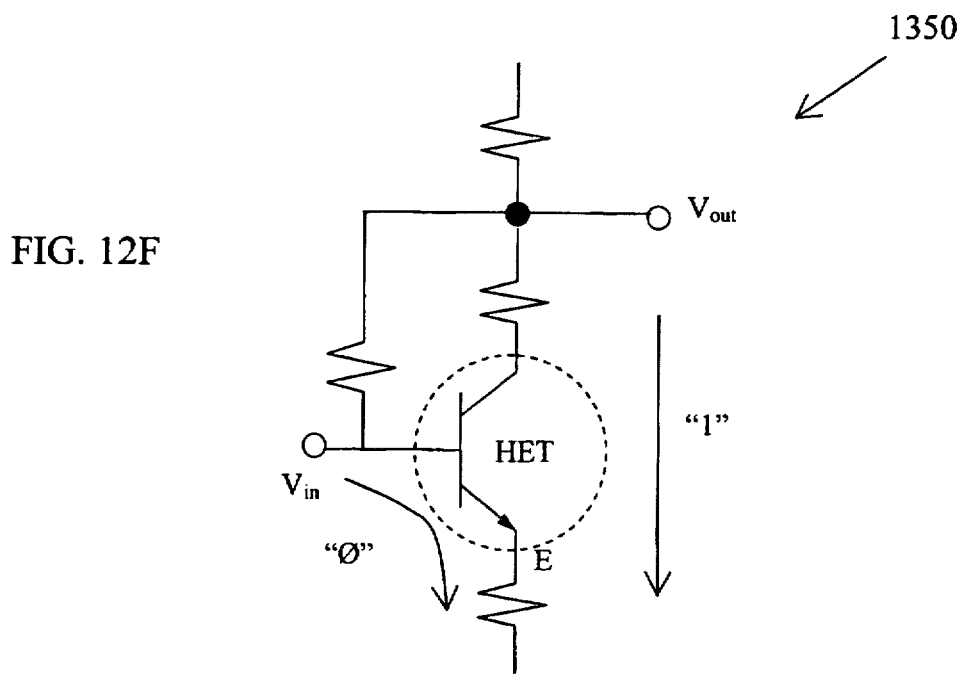
FIG. 12F is an equivalent circuit diagram of a multivibrator based on the hot electron transistor of the present invention.

The concept of a multivibrator follows from the SPDT switch concept above. With appropriate feedback from collector to base, the transistor may be made to oscillate output current between base and collector with the emitter as the common electrode. The equivalent circuit diagram of such a device is shown in FIG. 12F. For simplicity, the biasing CKT is not shown in FIG. 12F.

5. Nonlinear Amplifier/Pulse Generator

As we saw above, the hot electron transistor has a turn-on threshold when the emitted electrons have enough energy to surmount the collector barrier. Normally, one desires a flat gain response for linear amplification, and the transistor would have to be biased well above the threshold voltage. Occasionally, however, one has encounters an application where nonlinear gain is useful. One such application would be for a short pulse generator.

If we bias the transistor at the turn-on threshold (discussed above), where the current gain transitions from zero to its maximum value, transistor response is very nonlinear. An oscillatory input voltage between the base and emitter then creates a series of short current spikes at the collector output since gain is highest for input voltages above the threshold and zero for voltages below the threshold. If this train of current spikes is converted into a low voltage-swing signal and fed back into the nonlinear amplifier at the appropriate voltage level, the subsequent output spikes become even narrower. By appropriate voltage level, we mean that the input signal swing must not go beyond the gain saturation point of the transistor, otherwise the signal spikes will not get narrower. The limit for how narrow the output spikes may get is equal to $1/(2\pi f_{max})$, which for MIIMIM transistor structures considered to date may be as short as 100 fs, depending on base resistance. The ultimate limit would be $1/(2\pi f_T)$.

6. Frequency Multiplier

In a linear amplifier, we try to minimize the effect of oscillatory quantum mechanical reflections at the collector barrier for flat gain response; however, in certain applications, such as frequency multiplication, we may wish to use these sharp changes in gain to advantage. In this case, we make no attempt to reduce gain oscillations due to quantum mechanical reflections of the hot electrons. If we sweep the input base-emitter voltage across one or more of these oscillations, we will produce an output signal at a multiple of the input frequency. Thus, if we apply an oscillating input voltage that has a voltage swing sufficient equal to one period of the gain oscillations, the output signal will be at double the frequency of the input. If the input voltage sweeps across two gain oscillations, the output will be at quadruple the input frequency.

Figure 12G:
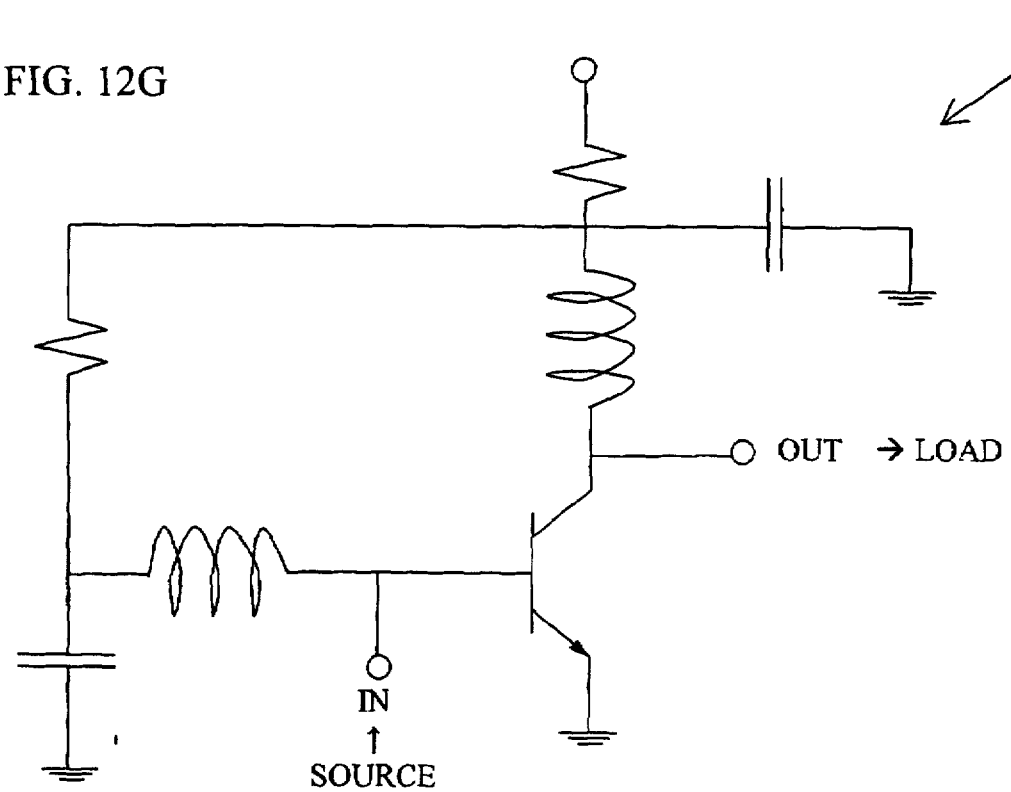
FIG. 12G is an equivalent circuit diagram of a common emitter, with positive biasing, based on the hot electron transistor of the present invention.

The equivalent circuit diagram for a common emitter 1400 based on these principles is shown in FIG. 12G. Common emitter 1400 acts as an NDK amplifier when based in the NDR region. Linear versus nonlinear amplification depends on the operating point of the transistor. Common emitter 1400 also acts as a frequency multiplier by the appropriate selection of transistor design. Common collector or base configuration are also possible. Discrete components may include RF transmission line components. A matching network may precede the load and/or follow the source. In addition, filtering and or cascading amplifiers are possible. The device may also act as an IR (or terahertz or microwave) detector by the use of such inputs.

Figure 12H:
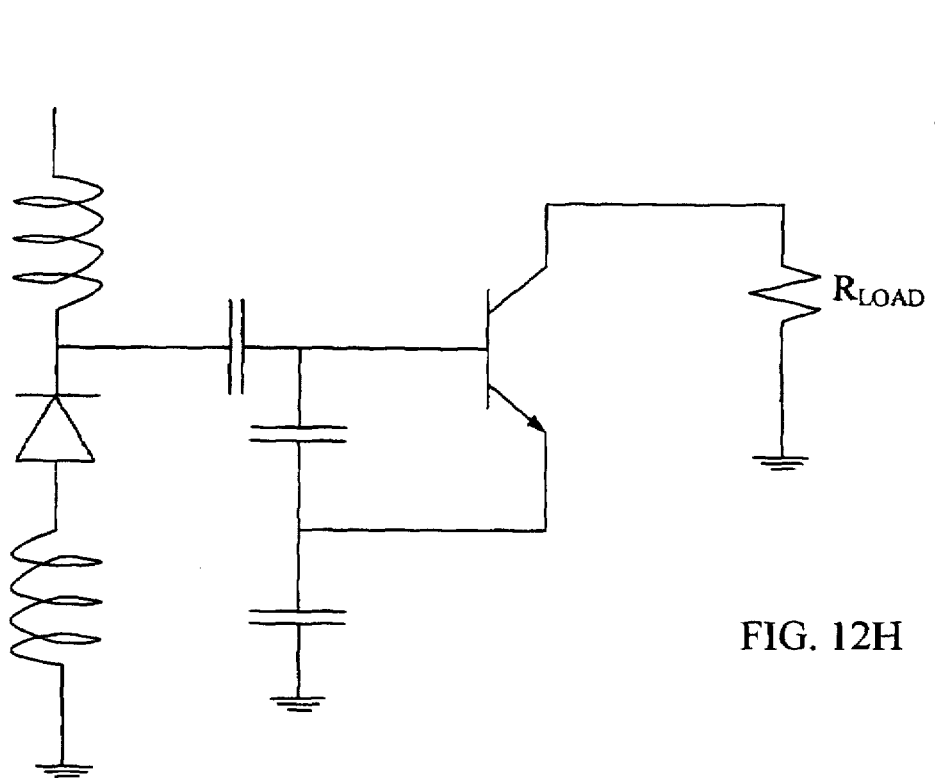
FIG. 12H is an equivalent circuit diagram of an oscillator with a varactor diode (for controlling oscillation voltage) based on the hot electron transistor of the present invention.

An equivalent circuit diagram for an oscillator with a varactor diode (such that the oscillation is voltage controlled) 1450 is shown in FIG. 12H. A variety of configuration, such as series, colpitts, Hartley, clap, common emitter, bose, collector, etc. are possible.

7. Nonlinear Rectifier/Mixer with Gain

Similarly to the application above, we may use relatively sharp turn-on response of the transistor to provide high nonlinearity for rectification and mixing applications. The transistor should be biased at the turn-on threshold, and the input signal should be between base and emitter. The output signal is collector current. The "sharpness" of the turn-on nonlinearity, and consequently the efficiency of rectification or mixing, is limited largely by the breadth of the hot electron distribution from the emitter. Here the MIIM emitter structure has an advantage over the MIM emitter. Base-collector bias voltage also has an effect on nonlinearity, with higher (collector positive with respect to base) voltages giving a sharper turn-on.

The transistor adds power gain to the signal by virtue of the base-collector bias voltage.

An added advantage of this rectifier/mixer device over conventional two-terminal diodes is that the input and output impedances may be different and tailored to match the specific source and load impedances. As an example, one may want to interface the input to a 200 Ω antenna as the source and drive a 50 Ω transmission line as the load.

We may also use gain oscillations due to quantum mechanical reflections in the collector to provide nonlinearity. Biasing the transistor at a negative-going gain peak will result in negative differential resistance.

Figure 12I:
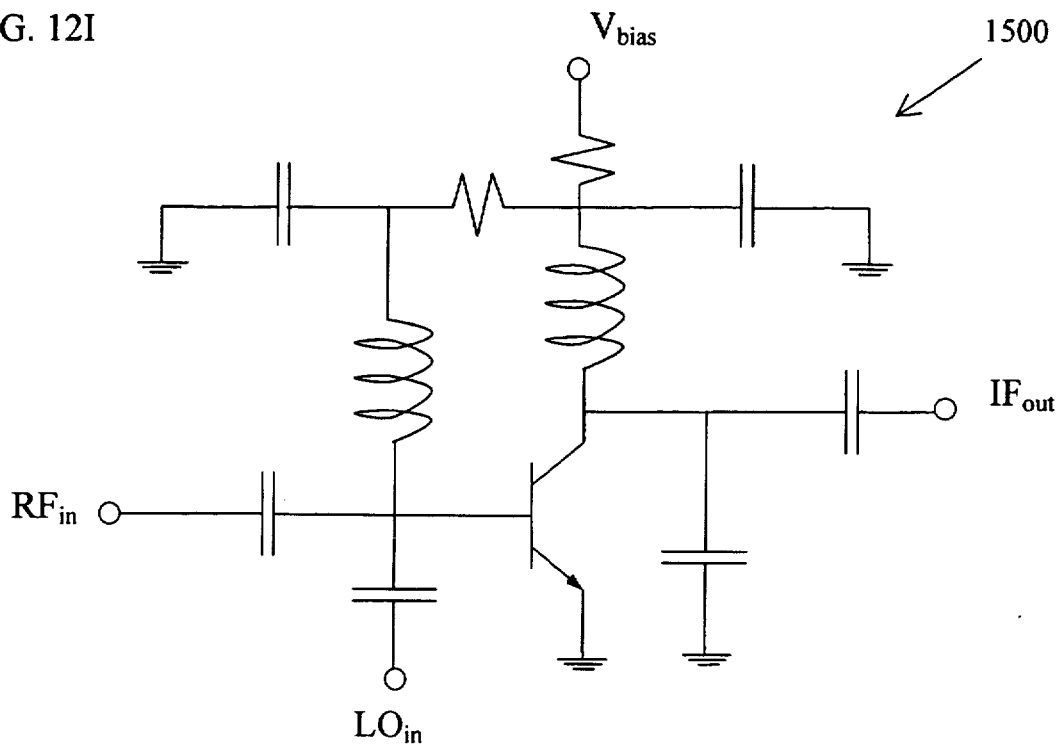
FIG. 12I is an equivalent circuit diagram of a mixer with input matching and output matching based on the hot electron transistor of the present invention.

An equivalent circuit diagram for a mixer 1500 based on such principles is shown in FIG. 12I. Mixer 1500 includes input matching and output matching. One significant advantage provided by mixer 1500 over a diode mixer is gain.

8. Infrared Detector with Gain

This application is similar to the rectifier/mixer application above, the difference being that for infrared input signals, photon-assisted tunneling is expected to dominate over classical rectification. In this case, photons lose their energy to tunneling electrons. Thus, the base-emitter voltage may be reduced below the turn-on threshold by as much as a photon energy. At lower bias, the base-emitter diode has lower DC bias current and therefore lower shot noise. Again, signal power gain is determined by the ratio of base-collector bias voltage and base-emitter bias voltage.

CONCLUSION

Figure 13:
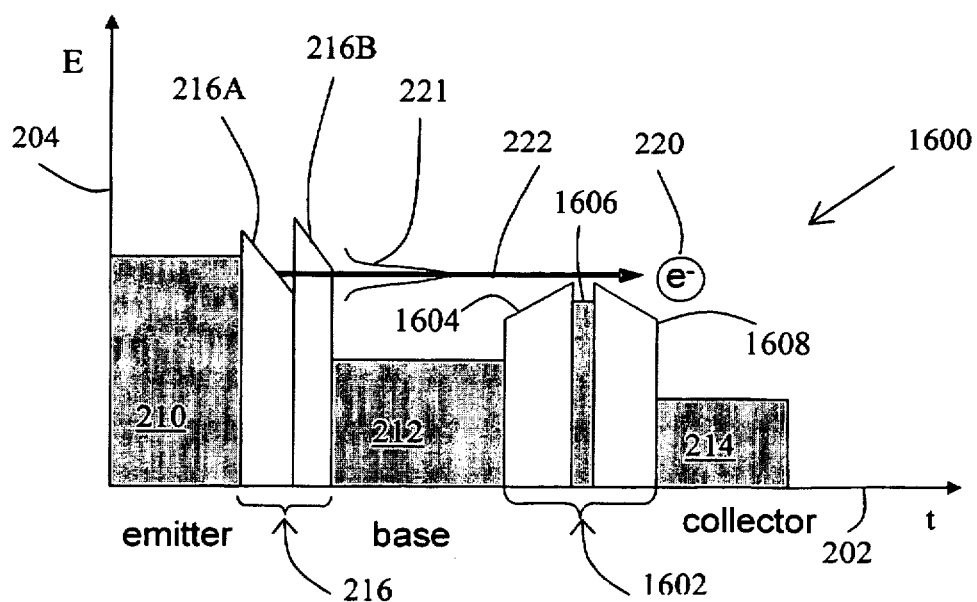
FIG. 13 is an energy band diagram illustrating the use of a double-insulator plus metal layer configuration in the collector barrier.

Although each of the aforedescribed physical embodiments have been illustrated with various components having particular respective orientations, it should be understood that the present invention may take on a variety of specific configurations with the various components being located in a wide variety of positions and mutual orientations. Furthermore, the methods described herein may be modified in an unlimited number of ways, for example, by forming the aforedescribed transistor devices on flexible substrates, thereby taking advantage of the compatibility of the transistor devices of the present invention with lower temperature substrates. Other modifications may include, but not limited to, a M-I-M-I-M-I-M emitter structure in the transistor, M-I-I-I-M emitter/collector structure in the transistor, N-M-N base electrode, the use of multiple insulator layers in the collector barrier, the addition of various matching/filter/biasing configurations to the applications, the implementation of various logic circuits based on the aforedescribed switch (e.g., NAND, NOR, inverter, etc.), and the connection of antennas as inputs/outputs for various applications. Also, a thin metal within the collector barrier may be used to apply a voltage within the collector barrier and, thereby, further tailor the barrier conduction band shape by application of an external voltage. An example of such a configuration is shown in FIG. 13, including an energy band diagram for a transistor configuration including a triple-layer collector barrier 1602, which in turn includes a first insulating layer 1604, a metal layer 1606 and a second insulating layer 1608. By application of an external voltage (not shown) to metal layer 1606, the overall shape of the energy band of collector barrier 1602 may be tailored as desired. This technique of using a thin metal, if applied normal to the direction of conduction, may further add additional barrier conduction band shaping control. Therefore, the present examples are to be considered as illustrative and not restrictive, and the invention is not to be limited to the details given herein but may be modified within the scope of the appended claims.

REFERENCES

[1] C. A. Mead, "Tunnel-Emission Amplifiers," *Proc. IRE*, 48, 359 (1960).

[2] Mordehai Heiblum, "Tunneling Hot Electron Transistor Amplifiers (THETA): Amplifiers Operating Up to the Infrared," *Solid State Elec.*, 24, 343 (1981).

[3] S. Muratake, M. Watanabe, T. Suemasu, and M. Asada, "Transistor action of metal ($CoSi_2$)/insulator ($CaF_2$) hot electron transistor structure," *Elec. Lett.*, 28, 1002 (1992).

[4a] M. Heiblum, M. I. Nathan, D. C. Thomas, and C. M. Knoedler, "Direct Observation of Ballistic Transport in GaAs," *Phys. Rev. Lett.*, 55, 2200 (1985).

[4b] A. Seabaugh, Y-C. Kao, J. Rndall, W. Frensely, A. Khatibzadeh, "Room Temperature Hot Electron Transistors with InAs-Notched Resonant-Tunneling-Diode Injector," *Japanese Journal of Appl. Phys.*, 30, 921 (1991).

[4c] D. Lacour, M. Hehn, F. Montaigne, H. Jaffres, P. Rottlander, G. Rodaray, F. Ghuyen Van Dau, F. Petroff, A. Schuhl, "Hot-electron transport in 3-terminal devices based on magnetic tunnel junctions," *Europhysics Letters*, 60, 896 (2002).

[4d] Satoshi Sugahara, Masaaki Tanaka, "Spin-Filter Transistor," *Japanese Journal of Applied Physics*, 43, L838 (2004).

[5] John G. Simmons, "Generalized Formula for the Electric Tunnel Effect Between Similar Electrodes Separated by a Thin Insulating Film," *J. Appl. Phys.*, 34, 1793 (1963).

[5b] John G. Simmons, "Electric Tunnel Effect between Dissimilar Electrodes Separated by a Thin Insulating Film," *J. Appl. Phys.*, 34, 2581 (1963).

[6] Mordehai Heiblum, private communication (2003).

[7] R. Ludeke, H. J. Wen, and Andreas Schenk, "Quantum interference in $SiO_2$: A conduction-band mass reappraisal," *Appl. Phys. Lett.*, 73, 1221 (1998).

[8] M. Heiblum, K. Seo, H. P. Meier, T. W. Hickmott, "First Observation of Ballistic Holes in a p-Type THETA Device," *IEEE Trans. On Electron Devices*, 35, 2428 (1988).

[9] A. Otto, "Controlling a tunnel current from the exterior: A new mesoscopic quantum effect," *Europhysics Letters*, 62, 398 (2003).

What is claimed is:

1. A transistor for receiving at least one input signal, said transistor comprising:
    an emitter electrode;
    a base electrode spaced apart from said emitter electrode such that at least a portion of said input signal may be applied across the emitter and base electrodes and, consequently, carriers are emitted from the emitter electrode toward the base electrode;
    a first tunneling structure disposed between said emitter and base electrodes and configured to serve as a transport of carriers between and to said emitter and base electrodes, said first tunneling structure including at least a first amorphous insulating layer and a different, second insulating layer disposed directly adjacent to and configured to cooperate with said first amorphous insulating layer such that the transport of carriers includes, at least in part, transport by tunneling;
    a collector electrode spaced apart from said base electrode; and
    a second tunneling structure disposed between said base and collector electrodes and configured to serve as a transport, between said base and collector electrodes, of at least a portion of said carriers emitted from said emitter electrode by ballistic transport such that the portion of the carriers is collectable at said collector electrode.

2. The transistor of claim 1, wherein at least a selected one of said base electrode and said collector electrode is formed, at least in part, of a semi-metal.

3. The transistor of claim 1 wherein at least a selected one of said base electrode and said collector electrode is formed, at least in part, of a metal-silicide.

4. The transistor of claim 1 wherein at least a selected one of said base electrode and said collector electrode is formed, at least in part, of a metal-nitride.

5. The transistor of claim 1 wherein said second tunneling structure is configured to exhibit a first value of hot electron reflection, and wherein said second tunneling structure includes a shaped barrier energy band characteristic such that said first value of hot electron reflection is lower than a second value of hot electron reflection that would be exhibited by the second tunneling structure without the shaped barrier energy band characteristic.

6. The transistor of claim 5 wherein said shaped barrier energy band characteristic includes a parabolic grading of said second tunneling structure.

7. The transistor of claim 5 wherein said shaped barrier energy band characteristic includes a rounded grading of said second tunneling structure.

8. The transistor of claim 5 wherein said shaped barrier energy band characteristic includes a linear grading of said second tunneling structure.

9. The transistor of claim 1 wherein said emitter electrode is configured to exhibit a given Fermi level, and wherein said first tunneling structure is configured to exhibit a given conduction band such that said given conduction band differs from said given Fermi level by less than 2 eV.

10. The transistor of claim 1 adapted as a hot hole transistor where said carriers are holes.

11. The transistor of claim 1 adapted as a hot electron transistor where said carriers are electrons.

* * * * *